US012490528B2

(12) United States Patent
Goto

(10) Patent No.: US 12,490,528 B2
(45) Date of Patent: Dec. 2, 2025

(54) PIXEL CELL CIRCUITRY FOR IMAGE SENSORS

(71) Applicant: OMNIVISION TECHNOLOGIES, INC., Santa Clara, CA (US)

(72) Inventor: Takayuki Goto, Foster City, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 630 days.

(21) Appl. No.: 17/886,955

(22) Filed: Aug. 12, 2022

(65) Prior Publication Data

US 2024/0055445 A1 Feb. 15, 2024

(51) Int. Cl.
*H10F 39/00* (2025.01)
*H10F 39/18* (2025.01)

(52) U.S. Cl.
CPC ......... *H10F 39/802* (2025.01); *H10F 39/014* (2025.01); *H10F 39/182* (2025.01); *H10F 39/811* (2025.01)

(58) Field of Classification Search
CPC .... H10F 39/802; H10F 39/014; H10F 39/182; H10F 39/811; H10F 39/80373; H10F 39/813; H10F 39/026
See application file for complete search history.

(56) References Cited

U.S. PATENT DOCUMENTS

| | | | |
|---|---|---|---|
| 7,323,754 | B2 | 1/2008 | Ema et al. |
| 9,025,063 | B2 | 5/2015 | Ahn et al. |
| 9,165,959 | B2 | 10/2015 | Chen et al. |
| 10,070,081 | B2 | 9/2018 | Mo et al. |
| 10,103,190 | B2 | 10/2018 | Korobov et al. |
| 10,438,989 | B2 | 10/2019 | Kim et al. |
| 2021/0082983 | A1 | 3/2021 | Kadura et al. |

FOREIGN PATENT DOCUMENTS

| | | | |
|---|---|---|---|
| EP | 3886144 | A1 | 9/2021 |
| WO | 2020105713 | A1 | 5/2020 |

OTHER PUBLICATIONS

Vincent C. Venezia, et al., 1.5μm Dual Conversion Gain, Backside Illuminated Image Sensor Using Stacked Pixel Level Connections with 13ke—Full-Well Capacitance and 0.8e—Noise, 2018, OmniVision Technologies, Santa Clara CA, 4 pages.
Vincent C. Venezia, et al., Second Generation Small Pixel Technology Using Hybrid Bond Stacking, OmniVision Technologies, Inc., Sensors, 2018, Santa Clara, CA, 8 pages.
U.S. Appl. No. 17/886,945, filed Aug. 12, 2022, 58 pages.

*Primary Examiner* — Robert G Bachner
(74) *Attorney, Agent, or Firm* — Christensen O'Connor Johnson Kindness PLLC

(57) ABSTRACT

An image sensor comprising a semiconductor substrate and pixel cell circuitry is described. The semiconductor substrate includes a first side and a second side opposite the first side. The pixel cell circuitry is disposed proximate to the first side of the semiconductor substrate. The pixel cell circuitry includes an arrangement of individual groups of components, each including a reset gate, a source-follower gate, and a row select gate. The individual groups of components included in the pixel cell circuitry includes a first group and a second group adjacent to the first group, and wherein the source-follower gate of the first group is disposed adjacent to the source-follower gate of the second group.

21 Claims, 15 Drawing Sheets

100

251-XX'

299

PIXEL CELL CIRCUITRY FOR IMAGE SENSORS

TECHNICAL FIELD

This disclosure relates generally to image sensors, and in particular but not exclusively, relates to CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Embodiments of an apparatus, system, and method each related to an image sensor or imaging system with pixel cell circuitry having a layout with mirror symmetry are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
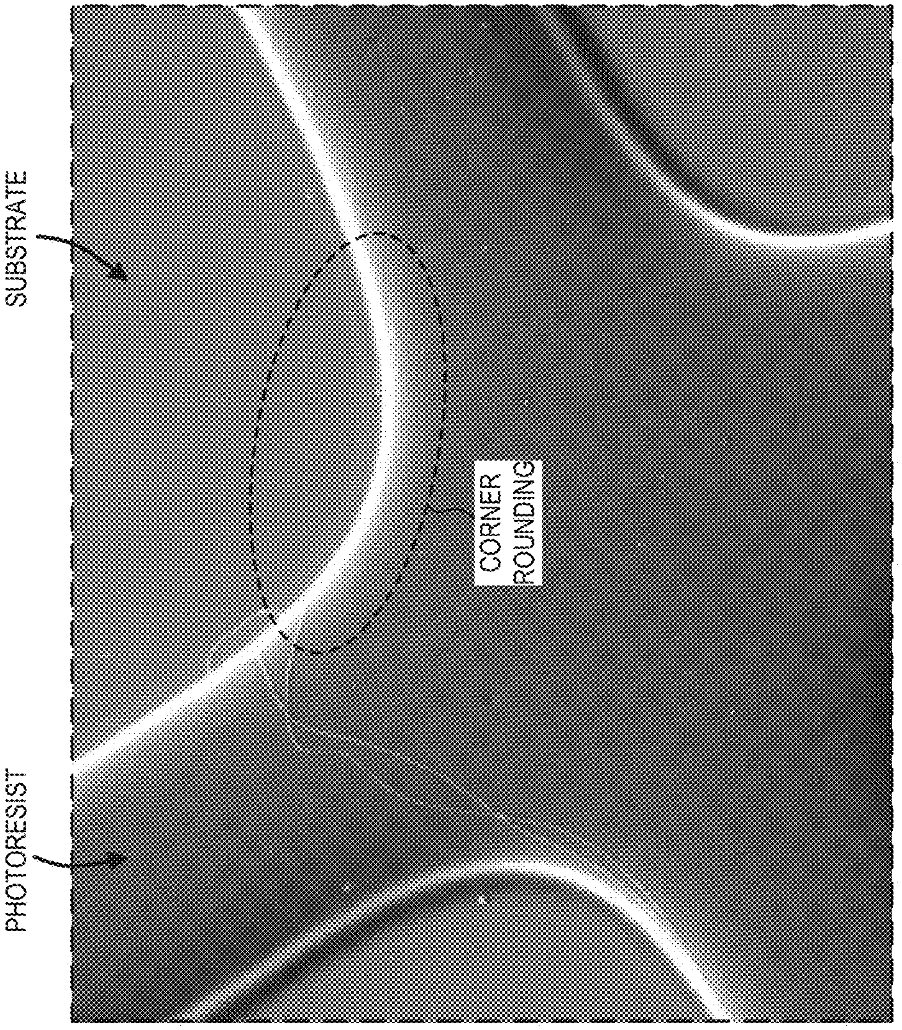
FIG. 1 illustrates an image of patterned photoresist deposited on a substrate with corner rounding for explaining a problem faced by conventional image sensors.

FIG. 1 illustrates an image 100 of patterned photoresist deposited on a substrate with corner rounding for explaining a problem faced by conventional image sensors. Achieving a ninety-degree corner pattern remains challenging with conventional lithographic techniques used in complementary metal-oxide semiconductor (CMOS) technology. The corner rounding of patterned photoresist that results may lead to processing variance, which in turn may lead to performance variance in devices being fabricated on the same or different semiconductor wafers. For example, CMOS technology commonly uses ion implantation, in which ions (e.g., boron, phosphorus, or other dopants) are implanted within regions of the semiconductor wafer to selectively doped the regions of the semiconductor wafer. However, implantation near the corner rounding of patterned photoresist may be inconsistent or otherwise vary dependent on how much corner rounding is present. Additionally, the degree of corner rounding for the patterned photoresist may not be uniform across the semiconductor wafer, which may further contribute to variance in devices fabricated on a common semiconductor wafer and/or devices fabricated on different semiconductor wafers. Moreover, as devices with smaller feature sizes are fabricated, the influence of processing variance, due to patterned photoresist with corner rounding, on the performance of said devices may increase. Further still, as feature sizes decrease, the degree of corner rounding in patterned photoresist to support the decreased feature sizes may increase and result in feature size restrictions, which may be expressed as design rule requirements dependent on the technology node being used. For example, it remains challenging to fabricate image sensors with a pixel pitch in a sub-micron range (e.g., less than 0.6 μm) when utilizing a 45 nm technology node. Similarly, fabrication and/or layout design of pixel cells or pixel transistor circuitry within a 1 $\mu m^2$ area when utilizing a 45 nm technology node also remains challenging.

Described herein are embodiments of an image sensor corresponding to or otherwise included in an imaging system with pixel cell circuitry having a layout with mirror symmetry to mitigate the effects of corner rounding in patterned photoresist and enable reduced pixel pitch. Advantageously, the layout for the pixel cell circuitry described in embodiments of the disclosure can fit within a 1 $\mu m^2$ area while reducing process variance attributed to corner rounding of patterned photoresist, meeting design rule requirements of a chosen technology node (e.g., 45 nm MOSFET technology node), and still allowing for precision control of performance characteristics (e.g., threshold voltage control or adjustment) for one or more transistors included in the pixel cell circuitry. In some embodiments, this is achieved in part by a multi-substrate image sensor in which multiple semiconductor substrates are utilized to form an image sensor package. However, it is appreciated that in other embodiments, an image sensor with reduced pixel pitch and mirror symmetric pixel cell circuitry layout may also be achieved with an individual semiconductor substrate or wafer. It is further appreciated that the term "semiconductor substrate" throughout the disclosure may correspond to a part of or an entirety of a semiconductor wafer (e.g., a silicon wafer). In some embodiments, the semiconductor substrate includes or is otherwise formed of silicon, a silicon germanium alloy, germanium, a silicon carbide alloy, an indium gallium arsenide alloy, any other alloys formed of III-V group compounds, combinations thereof, or a bulk substrate thereof.

Figure 2A:
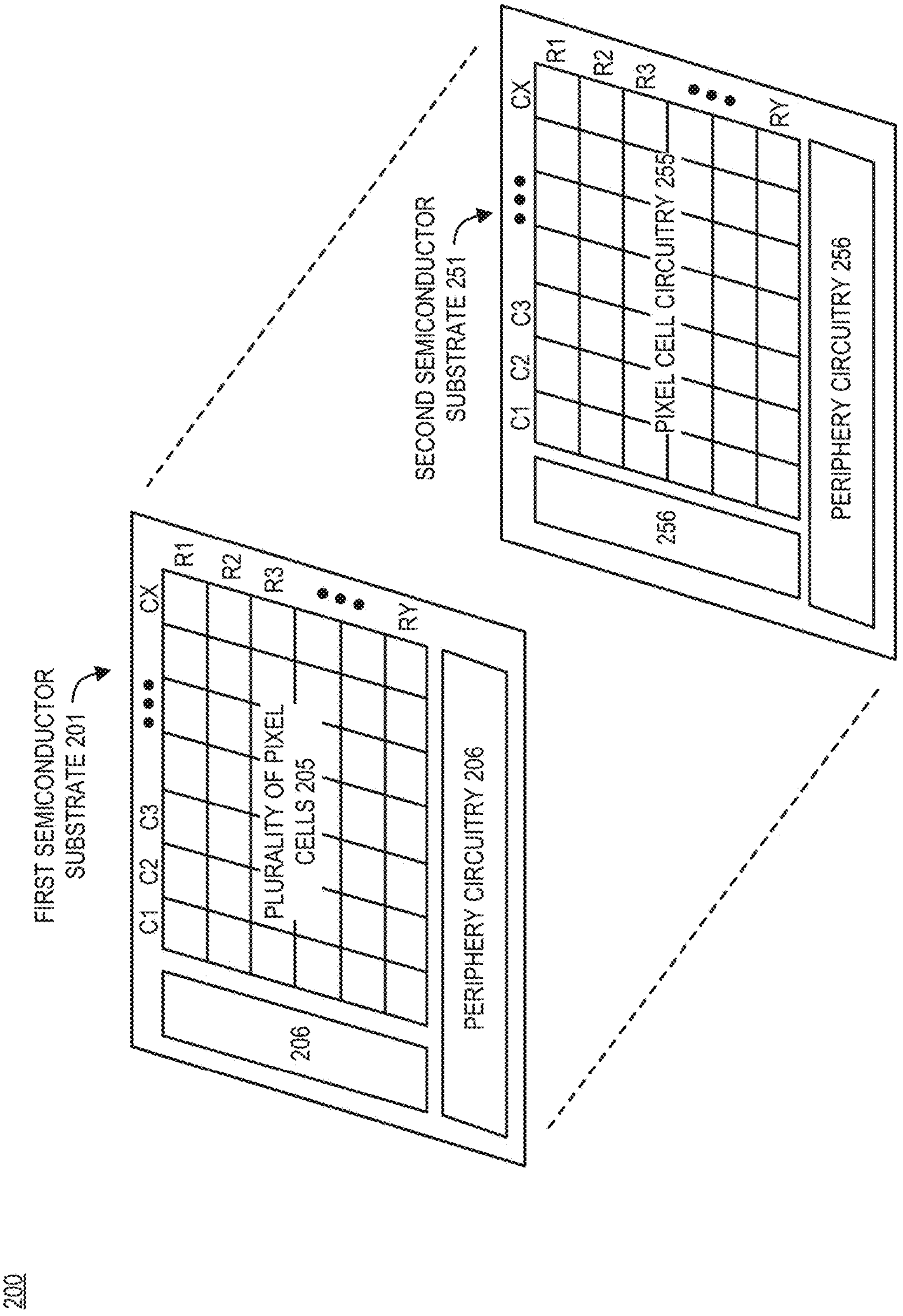
FIG. 2A illustrates an example imaging system including multiple semiconductor substrates and pixel cell circuitry having a layout with mirror symmetry, in accordance with embodiments of the present disclosure.

FIG. 2A illustrates an example imaging system 200 including multiple semiconductor substrates and pixel cell circuitry having a layout with mirror symmetry, in accordance with embodiments of the present disclosure. The imaging system 200 includes a first semiconductor substrate 201 and a second semiconductor substrate 251, each of which may correspond to a part of or an entirety of a semiconductor wafer in accordance with embodiments of the disclosure. The first semiconductor substrate 201 includes a plurality of pixel cells 205 and periphery circuitry 206. In some embodiments, each pixel cell included in the plurality of pixel cells 205 includes one or more pixels (see, e.g., FIG. 2C), which may share a common color filter (e.g., a group of four adjacent pixels arranged in a two-by-two pattern and optically aligned with a first color filter may form a first pixel cell included in the plurality of pixel cells 205). The second semiconductor substrate 251 includes pixel cell circuitry 255 and periphery circuitry 256. In some embodiments, the pixel cell circuitry 255 may be segmented into groups of components that are associated with respective pixel cells included in the plurality of pixel cells 205 to facilitate operation and/or readout for the imaging system 200 (see, e.g., FIGS. 2E-2H).

In the illustrated embodiment of FIG. 2A, the imaging system 200 is a stacked complementary metal-oxide semiconductor (CMOS) image sensor formed, at least in part, by the first semiconductor substrate 201 (e.g., a first die) and the second semiconductor substrate 251 (e.g., a second die) that are stacked and coupled together (e.g., electrically and/or physically) in a stacked chip scheme achieved via bonding (e.g., oxide bonding, metal bonding, hybrid bonding), silicon connections (e.g., through silicon vias), other suitable circuit coupling technologies, or combinations thereof. It is appreciated that while only the first semiconductor substrate 201 and the second semiconductor substrate 251 are illustrated in FIG. 2A, the stacked chip scheme of the imaging system 200 may include additional substrates (e.g., one or more additional substrates, dies, or chips different from the first semiconductor substrate 201 and the second semiconductor substrate 251) that may be integrated into the stacked chip scheme of the imaging system 200. Additionally, it is appreciated that the view presented in FIG. 2A may omit certain elements of the imaging system 200 to avoid obscuring details of the disclosure. In other words, not all elements of the imaging system 200 may be labeled, illustrated, or otherwise shown within FIG. 2A or other figures throughout the disclosure. It is further appreciated that in some embodiments, the imaging system 200 may not necessarily include all elements shown (e.g., when the imaging system 200 is not a stacked chip scheme, then the second semiconductor substrate 251 may be omitted while the pixel cell circuitry 255 and the periphery circuitry 256 may be disposed in or on the first semiconductor substrate 201).

Referring to the illustrated embodiment of FIG. 2A, the stacked chip scheme distributes components of the imaging system 200 across multiple substrates. Specifically, the first semiconductor substrate 201 includes photosensitive elements (e.g., a plurality of photodiodes such as pinned photodiodes or the like to form pixels) included in a plurality of pixel cells 205 while the second semiconductor substrate 251 includes pixel cell circuitry 255 associated with the plurality of pixel cells 205 (e.g., any one of or a combination of pixel transistors such as reset transistors, source-follower transistors, row select transistors, and so on, analog to digital circuitry, signal processing circuitry, or other circuitry to facilitate imaging an external scene with the pixels included in the plurality of pixel cells 205). Put in another way, the second semiconductor substrate 251 offloads at least part of the circuitry associated with the plurality of pixel cells 205 from the first semiconductor substrate 201, which advantageously provides additional space on the first semiconductor substrate 201 (e.g., to reduce pixel pitch, increase photodiode sensing area relative to total pixel area, and so on).

In some embodiments, the plurality of pixel cells 205 may be coupled to the pixel cell circuitry 255 through one or more hybrid bonds, through-silicon vias, other suitable circuitry coupling technologies, or combinations thereof. In some embodiments, the space saved on the first semiconductor substrate 201 by offloading circuitry to the second semiconductor substrate 251 (or other subsequent substrates in the stacked chip scheme) may be repurposed to increase the size of individual photodiodes included in each individual pixel included in the plurality of pixel cells 205 to allow for increased pixel size, density, sensitivity, combinations thereof, or the like. Additionally, or alternatively, functionality of the imaging system 200 may be facilitated as the second semiconductor substrate 251 may have room for additional components or circuitry that may not otherwise fit on an individual substrate that contains both the plurality of pixel cells 205 and the pixel cell circuitry 255 without affecting the performance and/or functionality of the imaging system 200 (see, e.g., FIG. 3). Additionally, it is appreciated that when reducing the pixel pitch of the plurality of pixel cells 205, there may be a commensurate increase in density for the pixel cell circuitry 255, which may place further constraints (e.g., in terms of meeting the design rule requirements dependent on the technology node being used for fabrication) on the design and layout of the pixel cell circuitry 255. Accordingly, the layout for the pixel cell circuitry 255 described in embodiments of the disclosure provides a suitable configuration for facilitating reduced pixel pitch while simultaneously mitigating processing variations associated with corner rounding of patterned photoresist.

In the illustrated embodiment, the imaging system 200 comprises the first semiconductor substrate 201 and the second semiconductor substrate 251 coupled to the first semiconductor substrate 201. The first semiconductor substrate 201 includes the plurality of pixel cells 205, which are arranged in rows (e.g., R1, R2, R3, RY) and columns (e.g., C1, C2, C3, CX) to form an array of pixel cells. Each of the plurality of pixel cells 205 may include any number of pixels (e.g., one, two, four, eight, or more pixels per pixel cell). In most embodiments, the number of pixels per pixel cell included in the plurality of pixel cells 205 is uniform. In one embodiment, each pixel cell included in the plurality of pixel cells 205 have a regular arrangement (e.g., a two-by-two arrangement of four pixels, a two-by-three arrangement of six pixels, a two-by-four arrangement of eight pixels, a four-by-four arrangement of sixteen pixels, or otherwise). In some embodiments, an individual pixel cell included in the plurality of pixel cells 205 may correspond to a minimal repeating unit of the first semiconductor substrate 201, or more specifically, the plurality of pixel cells 205. In other embodiments, a group of pixel cells included in the plurality of pixel cells 205 may correspond to a minimal repeating unit of the first semiconductor substrate 201 and/or the plurality of pixel cells 205 (e.g., a two-by-two group of pixel cells included in the plurality of pixel cells 205 may correspond to a minimal repeating unit). In some embodiments, the pixel cell circuitry 255 of the second semiconductor substrate 251 is arranged based on a corresponding arrangement of the plurality of pixel cells 205 on the first semiconductor substrate 201. For example, in some embodiments, individual pixel cells included in the plurality of pixel cells 205 of the first semiconductor substrate 201 may be respectively coupled to individual groups of components included in the pixel cell circuitry 255 of the second semiconductor substrate 251 on a per-pixel or per-pixel cell basis, which may result in an arrangement of the pixel cell circuitry 255 being regular and/or repeating (e.g., in rows and columns as illustrated).

As illustrated in FIG. 2A, the first semiconductor substrate 201 and the second semiconductor substrate 251 include various analog and/or digital support circuitry for the imaging system 200, respectively corresponding to the periphery circuitry 206 and the periphery circuitry 256. In some embodiments, support circuitry that may be included in the periphery circuitry 206 and/or the periphery circuitry 256 may include, but is not limited to, row and column decoders and drivers, analog signal processing chains, digital imaging processing blocks, memory, timing and control circuits, input/output interfaces, a vertical scanner, sample and hold circuitry, amplifiers, analog-to-digital converter circuitry, and any other embodiments of logic and/or circuitry that is appropriate for the function of the imaging system 200.

Figure 2B:
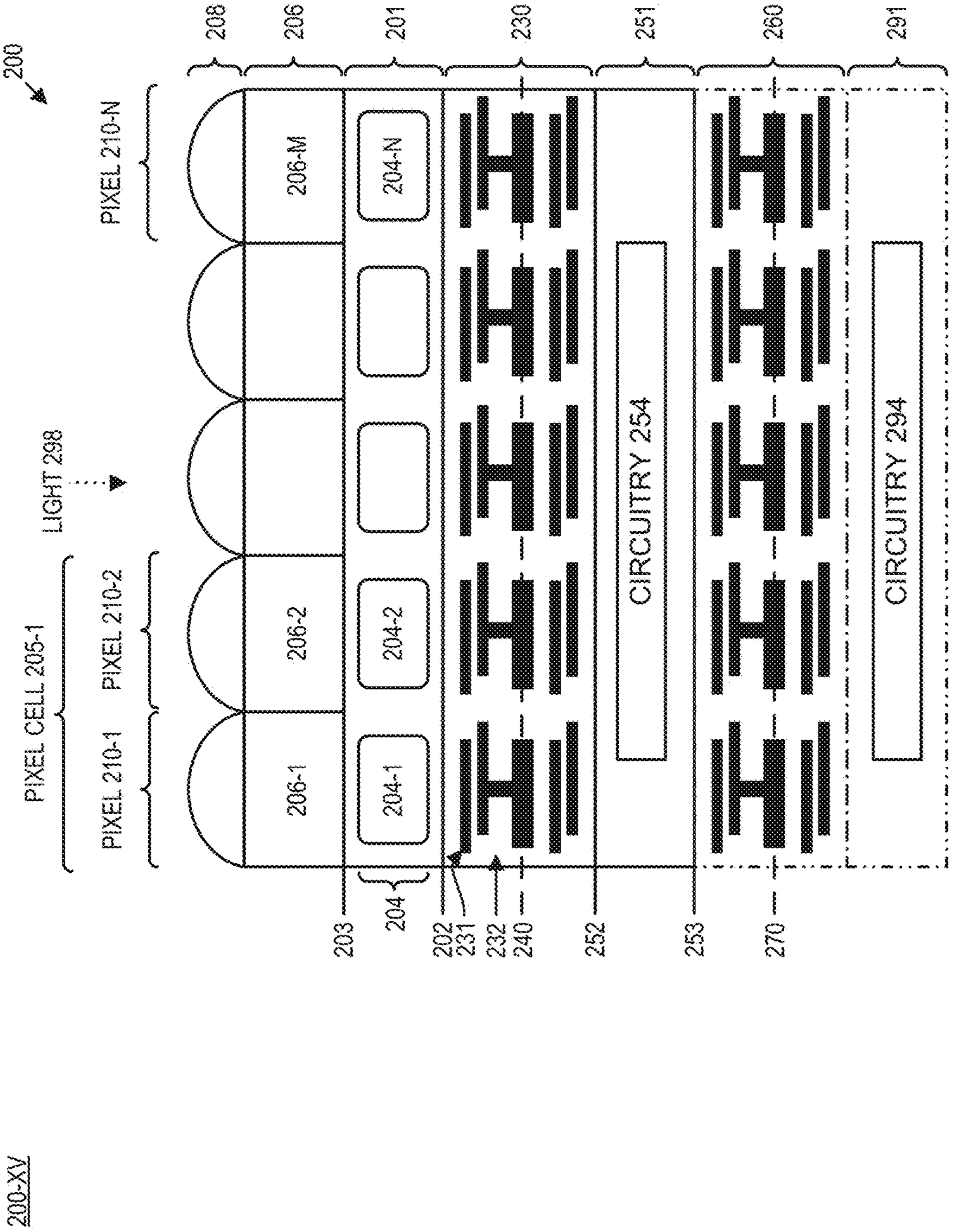
FIG. 2B illustrates a cross-sectional view of the example imaging system of FIG. 2A, in accordance with embodiments of the present disclosure.

FIG. 2B illustrates a cross-sectional view 200-XV of the example imaging system 200 of FIG. 2A, in accordance with an embodiment of the present disclosure. The imaging system 200 includes the first semiconductor substrate 201, the second semiconductor substrate 251, and optionally a third semiconductor substrate 291. As illustrated, the second semiconductor substrate 251 is disposed between the first semiconductor substrate 201 and the optional third semiconductor substrate 291. The first semiconductor substrate 201 is coupled to the second semiconductor substrate 251 at interface 240 via metallization layer 230, which includes one or more metal layers 231 disposed between one or more intermetal dielectric layers 232 (e.g., in the form one or more hybrid bonds). In some embodiments, other stacking connection schemes may be utilized in addition to, or in place of hybrid bonding, such as through-silicon vias, a combination of hybrid bonding and through-silicon vias, or other suitable circuitry coupling technologies. It is appreciated that in the illustrated embodiment, the metallization layer 260 similarly couples the second semiconductor substrate 251 to the optional third semiconductor substrate 291 at interface 270.

As illustrated, the imaging system 200 further includes a plurality of photodiodes 204 (e.g., a first photodiode 204-1, a second photodiode 204-2, and so on until a Nth photodiode 204-N, where "N" corresponds to the total number of photodiodes included in the plurality of photodiodes 204) disposed between a first side 202 (e.g., a front side or a backside) and a second side 203 (e.g., a backside or a front side) opposite the first side 202 of the first semiconductor substrate 201, a plurality of color filters 206 (e.g., a first color filter 206-1, a second color filter 206-2, and so on until a Mth color filter 206-M, where "M" corresponds to the total number of color filters included in the plurality of color filters 206), and a plurality of microlenses 208 to collectively form a plurality of pixels 210 (e.g., a first pixel 210-1, a second pixel 210-2, and so until a Nth pixel 210-N, wherein "N" corresponds to the total number of pixels included in the plurality of pixels 210). As discussed previously the plurality of pixels 210 are segmented to form pixel cells included in the plurality of pixel cells 205 (e.g., a first pixel cell 205-1 as illustrated, which may be representative of any other pixel cell included in the plurality of pixel cells 205). It is appreciated that in some embodiments, the total number of color filters (e.g., "M") included in the plurality of color filters 206 may be equal to the total number of photodiodes (e.g., "N") included in the plurality of photodiodes 204 (e.g., a one-to-one ratio of color filters to photodiodes). However, in other embodiments the plurality of color filters 206 may be shared by adjacent photodiodes included in the plurality of photodiodes 204 such that "M" is less than "N." For example, in some embodiments each pixel cell included in the plurality of pixel cells 205 may include multiple pixels included in the plurality of pixels 210. In some embodiments, pixels included in the plurality of pixels 210 for a common pixel cell included in the plurality of pixel cells 205 (e.g., the first pixel 210-1 and the second pixel 210-2 are included in the first pixel cell 205-1) may share the same color filter or otherwise have a common color filter configuration (e.g., the first color filter 206-1 and the second color filter 206-2 may have a common spectral photoresponse).

As illustrated, the plurality of color filters 206 are optically disposed between the plurality of microlenses 208 and the plurality of photodiodes 204 such that light 298 propagates through both the plurality of microlenses 208 and the plurality of color filters 206 before reaching the plurality of photodiodes 204 (i.e., when the imaging system 200 is a backside illuminated image sensor). Each microlens included in the plurality of microlenses 208 is configured to direct or otherwise focus the light 298 through an underlying color filter included in the plurality of color filters 206 and the second side 203 of the first semiconductor substrate 201 towards a respective one of the plurality of photodiodes 204 in the first semiconductor substrate 201. The plurality of color filters 206 filter or otherwise attenuate the light 298 focused by the plurality of microlenses 208. In some embodiments, the plurality of color filters 206 may include one or more red, green, blue, infrared, clear, transparent, cyan, magenta, yellow, black, or any other color filter to filter visible or non-visible light (e.g., the light 298). Similar to the plurality of color filters 206, the total number of microlenses included in the plurality of microlenses 208 may be equal to the total number of photodiodes (e.g., "N") included in the plurality of photodiodes 204 (e.g., a one-to-one ratio of microlenses to photodiodes) and/or the total number of color filters (e.g., "M") included in the plurality of color filters 206 (e.g., a one-to-one ratio of microlenses to color filters). However, in other embodiments the plurality of microlenses 208 may be shared by adjacent photodiodes included in the plurality of photodiodes 204 (e.g., a group of adjacent photodiodes included in the plurality of photodiodes 204, such as the first photodiode 204-1, the second photodiode 204-2, and/or other photodiodes adjacent to the first photodiode 204-1 and the second photodiode 204-2, may be optically aligned with or otherwise share an individual microlens included in the plurality of microlenses 208).

As illustrated in FIG. 2B, circuitry 254 is disposed in or on the second semiconductor substrate 251 and circuitry 294 is disposed in or on the optional third semiconductor substrate 291. In some embodiments, the circuitry 254 includes the pixel cell circuitry 255 and the periphery circuitry 256 illustrated in FIG. 2A (e.g., pixel transistors such as reset transistors, source-follower transistors, row select transistors, and so on, analog to digital circuitry, signal processing circuitry, and other circuitry to facilitate imaging an external scene). In the same or other embodiments, certain circuitry elements may be offloaded to the optional third semiconductor substrate 291 (e.g., analog to digital circuitry, signal processing circuitry, phase detection, and other circuitry to facilitate imaging). It is appreciated that in some embodiments, certain circuitry elements may also be present in or on the first semiconductor substrate 201 that are not illustrated in FIG. 2A (e.g., one or more transfer gates, floating diffusion regions, and the like as illustrated in FIGS. 2C-2D).

Figure 2C:
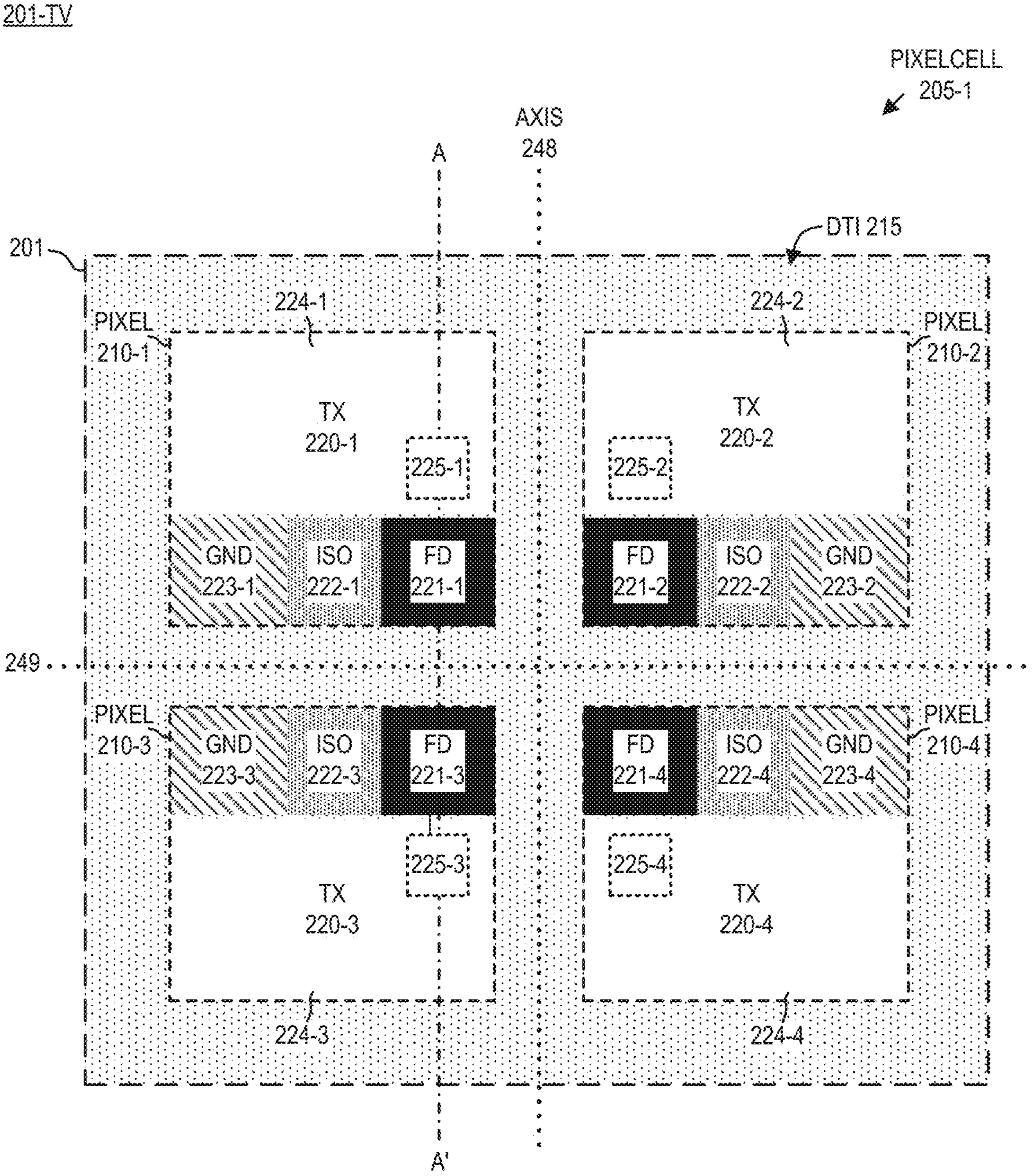
FIG. 2C illustrates a top view of a first semiconductor substrate included in the example imaging system of FIG. 2A, in accordance with embodiments of the present disclosure.
Figure 2D:
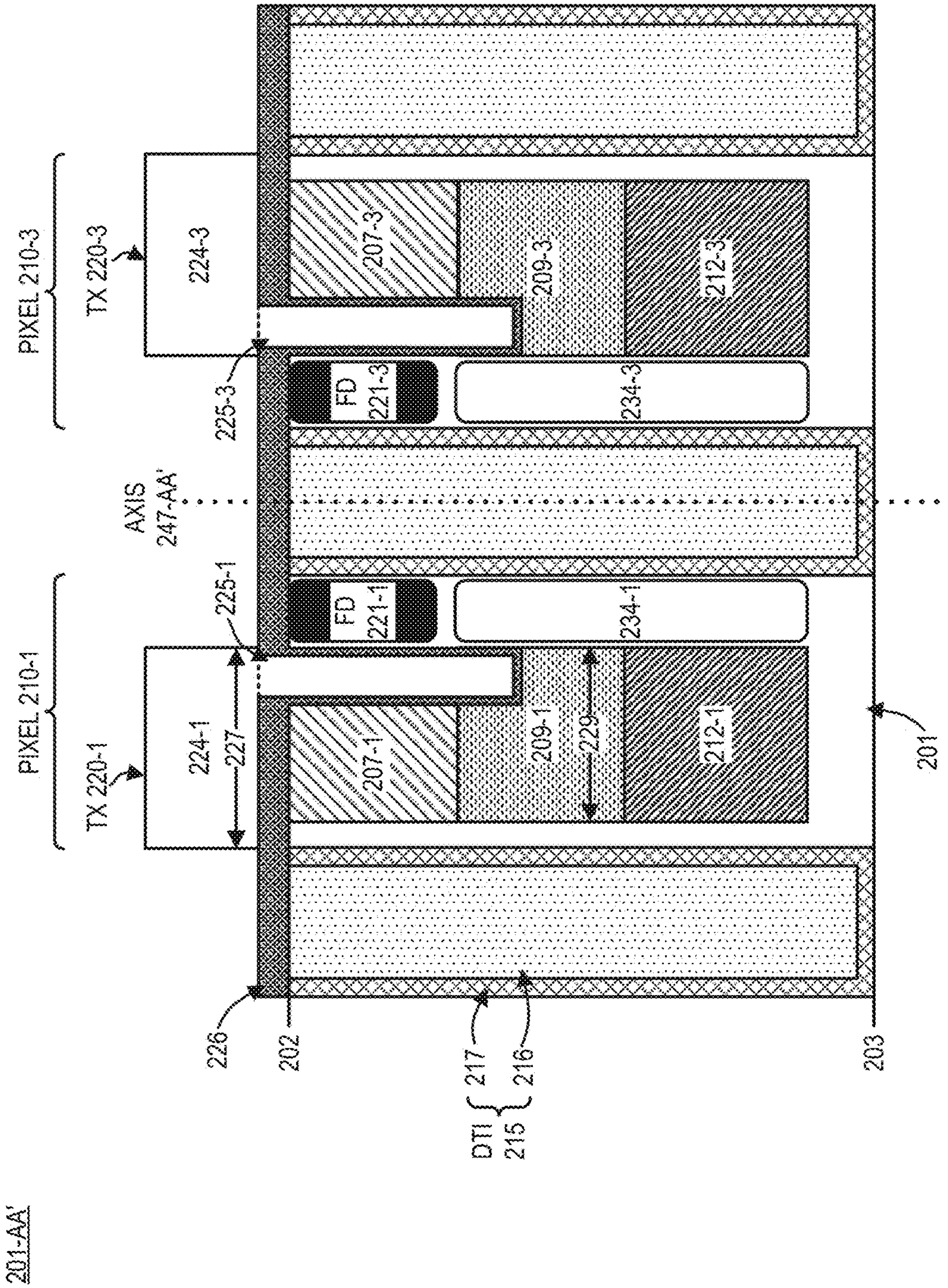
FIG. 2D illustrates a cross-sectional view of the first semiconductor substrate along line A-A' shown in FIG. 2C, in accordance with embodiments of the present disclosure.

FIG. 2C illustrates a top view 201-TV of the first semiconductor substrate 201 included in the example imaging system 200 of FIG. 2A, in accordance with embodiments of the present disclosure. More specifically, the top view 201-TV is a schematic representative of a planar view extending through the metallization layer 230 illustrated in FIG. 2B looking towards the first semiconductor substrate 201. It is appreciated that certain elements may be omitted (e.g., the intermetal dielectric layers 232) or otherwise be obstructed from view (e.g., the plurality of color filters 206, the plurality of microlenses 208) to avoid obscuring certain aspects of the disclosure.

Referring back to FIG. 2C, the top view 201-TV shows the first pixel cell 205-1 included in the plurality of pixel cells 205. In some embodiments, the first pixel cell 205-1 is representative of any other pixel cell included in the plurality of pixel cells 205 (i.e., other pixel cells included in the plurality of pixel cells 205 may correspond to different instances of the first pixel cell 205-1). The first pixel cell 205-1 includes a two-by-two group of pixels included in the plurality of pixels 210 (e.g., the first pixel 210-1, the second pixel 210-2, a third pixel 210-3, and a fourth pixel 210-4) disposed within the first semiconductor substrate 201. As illustrated individual pixels included in the plurality of pixels 210 are separated from one another by a deep trench isolation (DTI) structure 215). Similarly, individual pixel cells included in the plurality of pixel cells 205 are separated from one another by the DTI structure 215 (not illustrated). The top view 201-TV further shows a plurality of transfer gates (TX) 220 (e.g., a first transfer gate 220-1 of the first pixel 210-1, a second transfer gate 220-2 of the second pixel 210-2, a third transfer gate 220-3 of the third pixel 210-3, and a fourth transfer gate 220-4 of the fourth pixel 210-4), a plurality of floating diffusion regions (FD) 221 (e.g., a first floating diffusion region 221-1 of the first pixel 210-1, a second floating diffusion region 221-2 of the second pixel 210-2, a third floating diffusion region 221-3 of the third pixel 210-3, and a fourth floating diffusion region 221-4 of the fourth pixel 210-4), a plurality of isolation regions (ISO) 222 (e.g., a first isolation region 222-1 of the first pixel 210-1, a second isolation region 222-2 of the second pixel 210-2, a third isolation region 222-3 of the third pixel 210-3, and a fourth isolation region 222-4 of the fourth pixel 210-4), and a plurality of ground contact regions (GND) 223 (e.g., a first ground contact region 223-1 of the first pixel 210-1, a second ground contact region 223-2 of the second pixel 210-2, a third ground contact region 223-3 of the third pixel 210-3, and a fourth ground contact region 223-4 of the fourth pixel 210-4), which are constituent components of the plurality of pixels 210 included in the first pixel cell 205-1. It is further appreciated, that each one of the plurality of pixels 210 also includes a corresponding photodiode (see, e.g., FIG. 2D) covered in the illustrated view of FIG. 2C, by an associated transfer gate included in the plurality of transfer gates 220 (e.g., the first pixel 210-1 includes a photodiode covered by or otherwise optically aligned with the first transfer gate 220-1 when viewed towards the first side of the first semiconductor substrate 201). Accordingly, the first pixel 210-1, the second pixel 210-2, the third pixel 210-3, and the fourth pixel 210-4 each include respective instances of a photodiode (e.g., the plurality of photodiodes 204 illustrated in FIG. 2B), a transfer gate (e.g., the plurality of transfer gates 220 illustrated in FIG. 2C), a ground contact region (e.g., the plurality of ground contact regions 223 illustrated in FIG. 2C), a floating diffusion region (e.g., the plurality of floating diffusion regions 221 illustrated in FIG. 2C), and an isolation region (e.g., the plurality of isolation regions 222 illustrated in FIG. 2C) between the ground contact region and the floating diffusion region. It is appreciated that for a given pixel (e.g., any of the first pixel 210-1, the second pixel 210-2, the third pixel 210-3, or the fourth pixel 210-4) included in the pixel cell 205-1, the isolation region 222 provides physical separation (i.e., isolation) of the floating diffusion region 221 and the ground contact region 223 (e.g., the first isolation region 222-1 physically separates the first floating diffusion region 221-1 from the first ground contact region 223-1 of the first pixel 210-1).

Figure 2E:
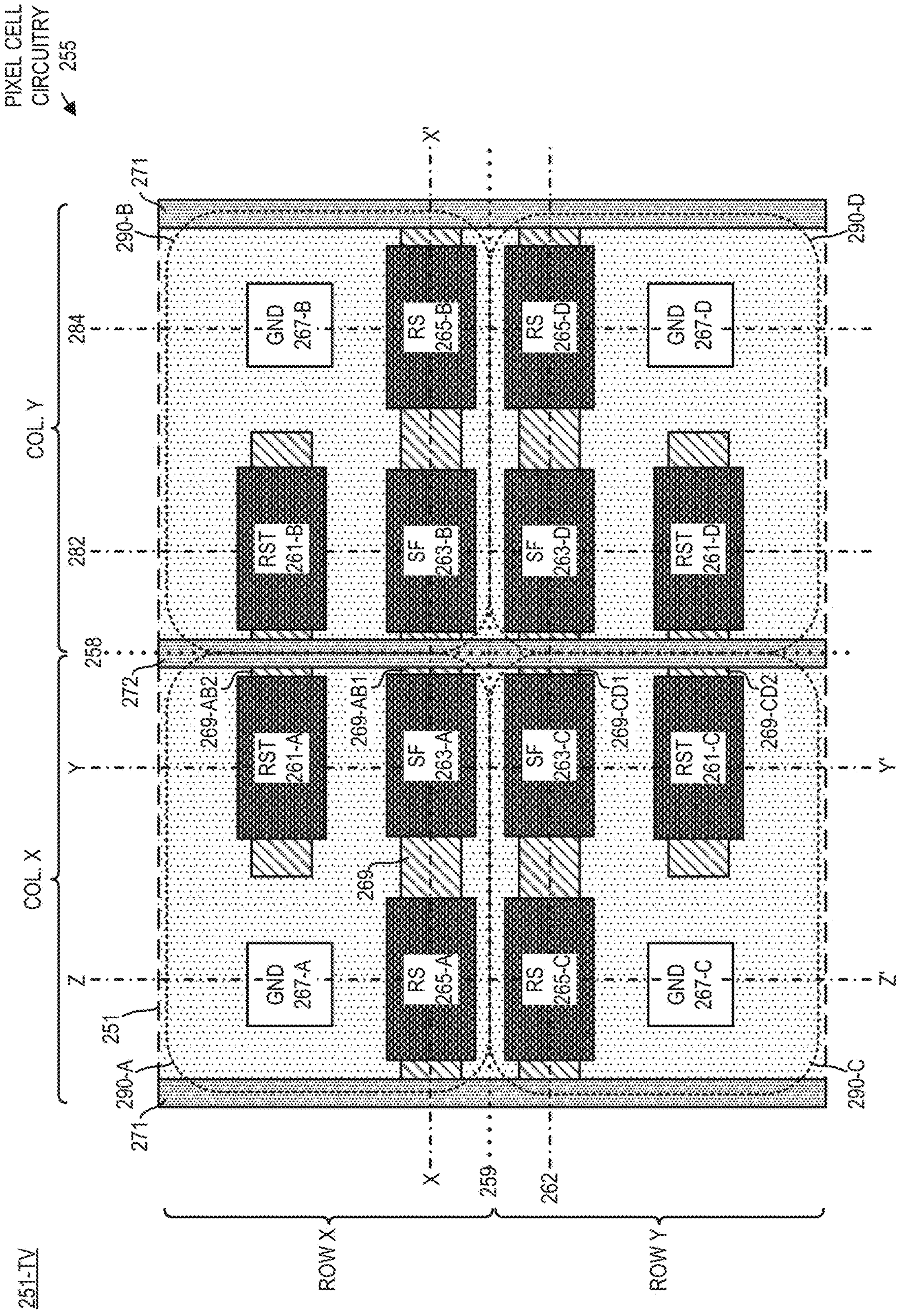
FIG. 2E illustrates a top view of a second semiconductor substrate included in the example imaging system of FIG. 2A, in accordance with embodiments of the present disclosure.
Figure 2F:
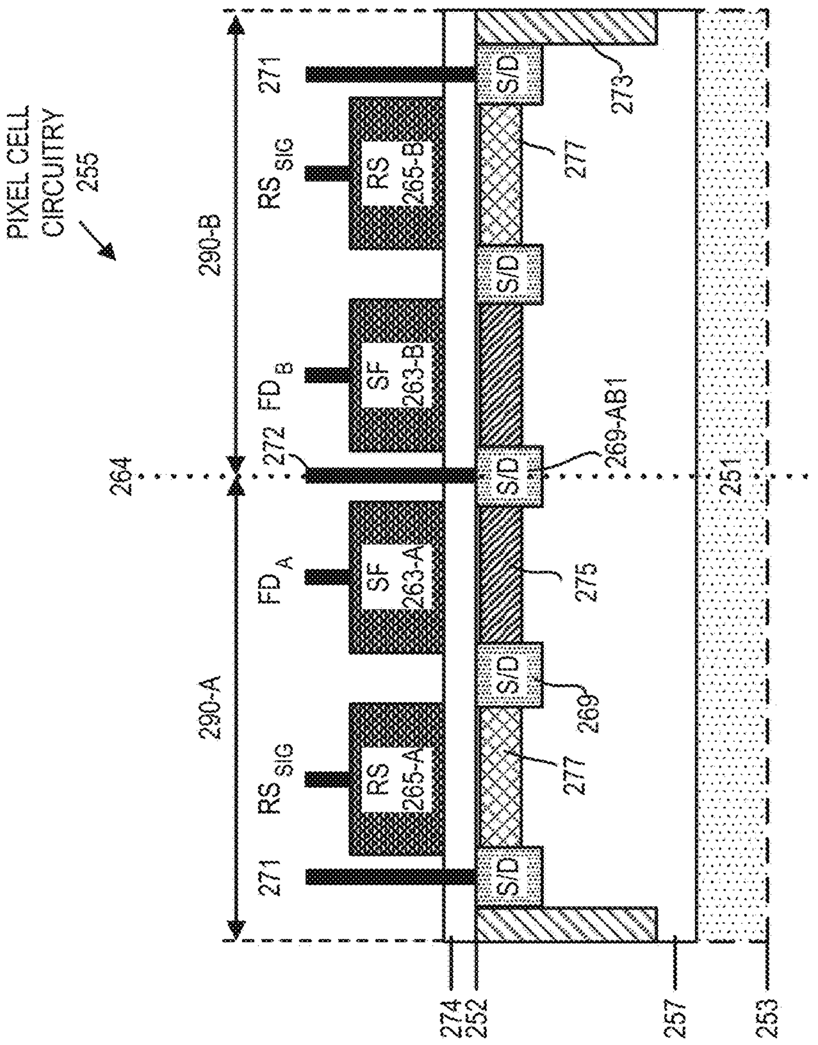
FIG. 2F illustrates a cross-sectional view of the second semiconductor substrate along line X-X' shown in FIG. 2E, in accordance with embodiments of the present disclosure.
Figure 2G:
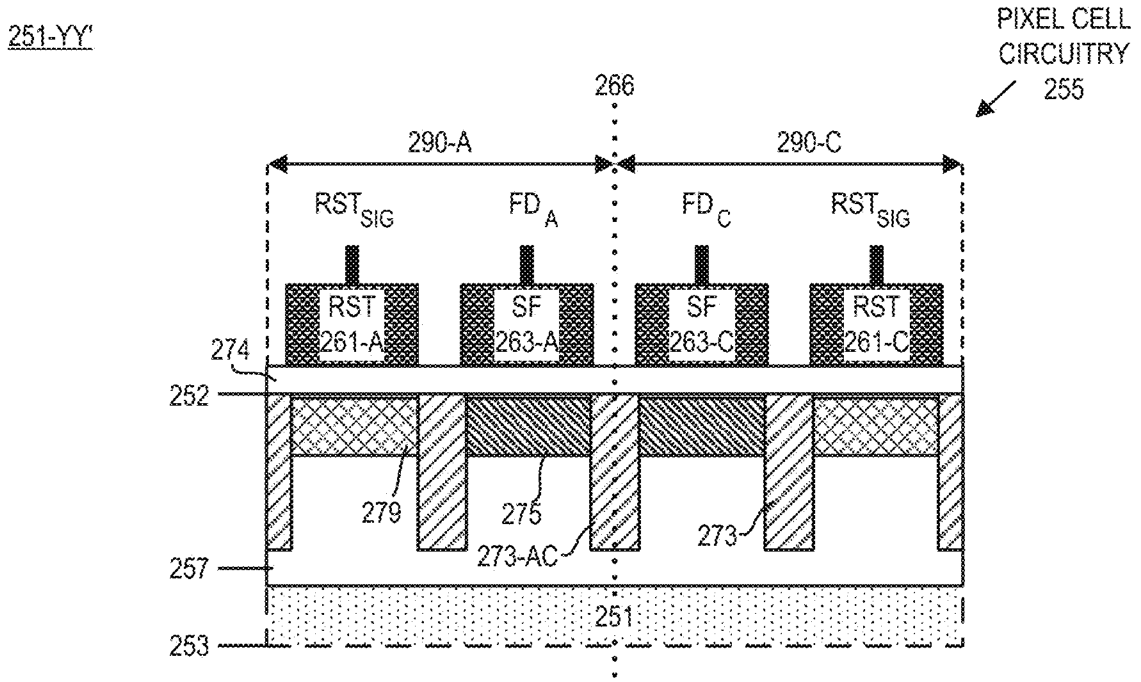
FIG. 2G illustrates a cross-sectional view of the second semiconductor substrate along line Y-Y' shown in FIG. 2E, in accordance with embodiments of the present disclosure.
Figure 2H:
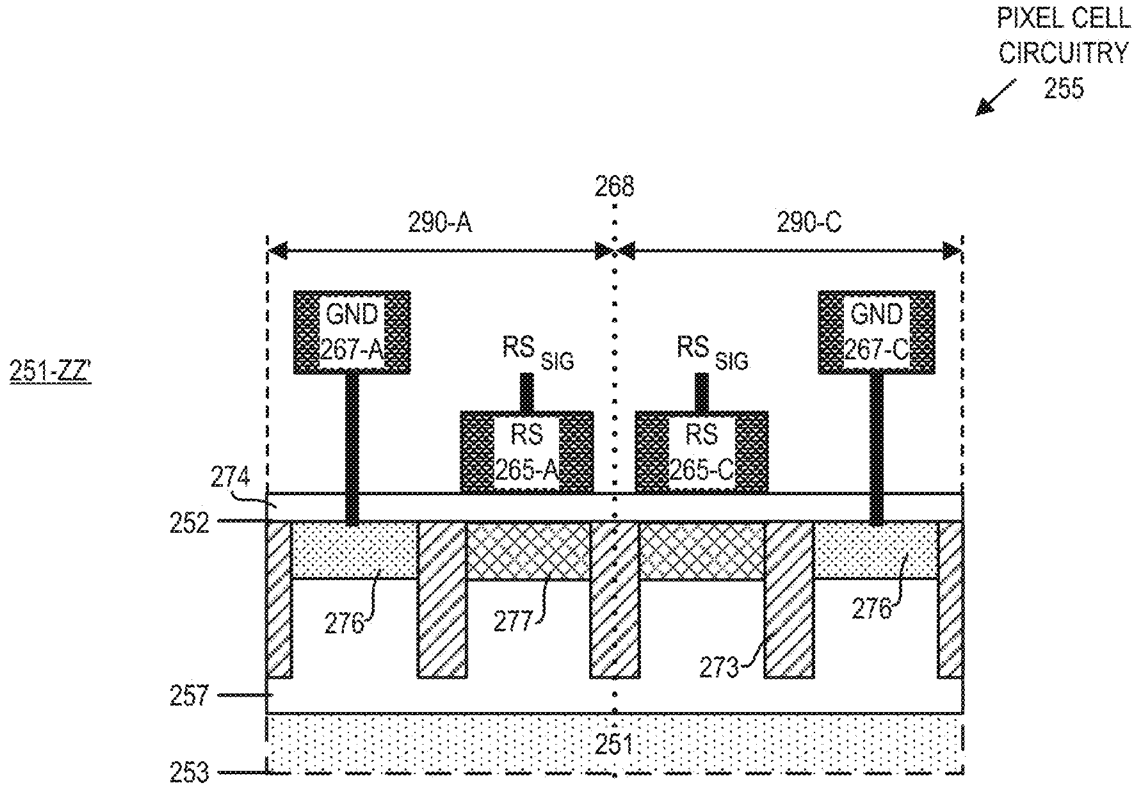
FIG. 2H illustrates a cross-sectional view of the second semiconductor substrate along line Z-Z' shown in FIG. 2E, in accordance with embodiments of the present disclosure.
Figure 2I:
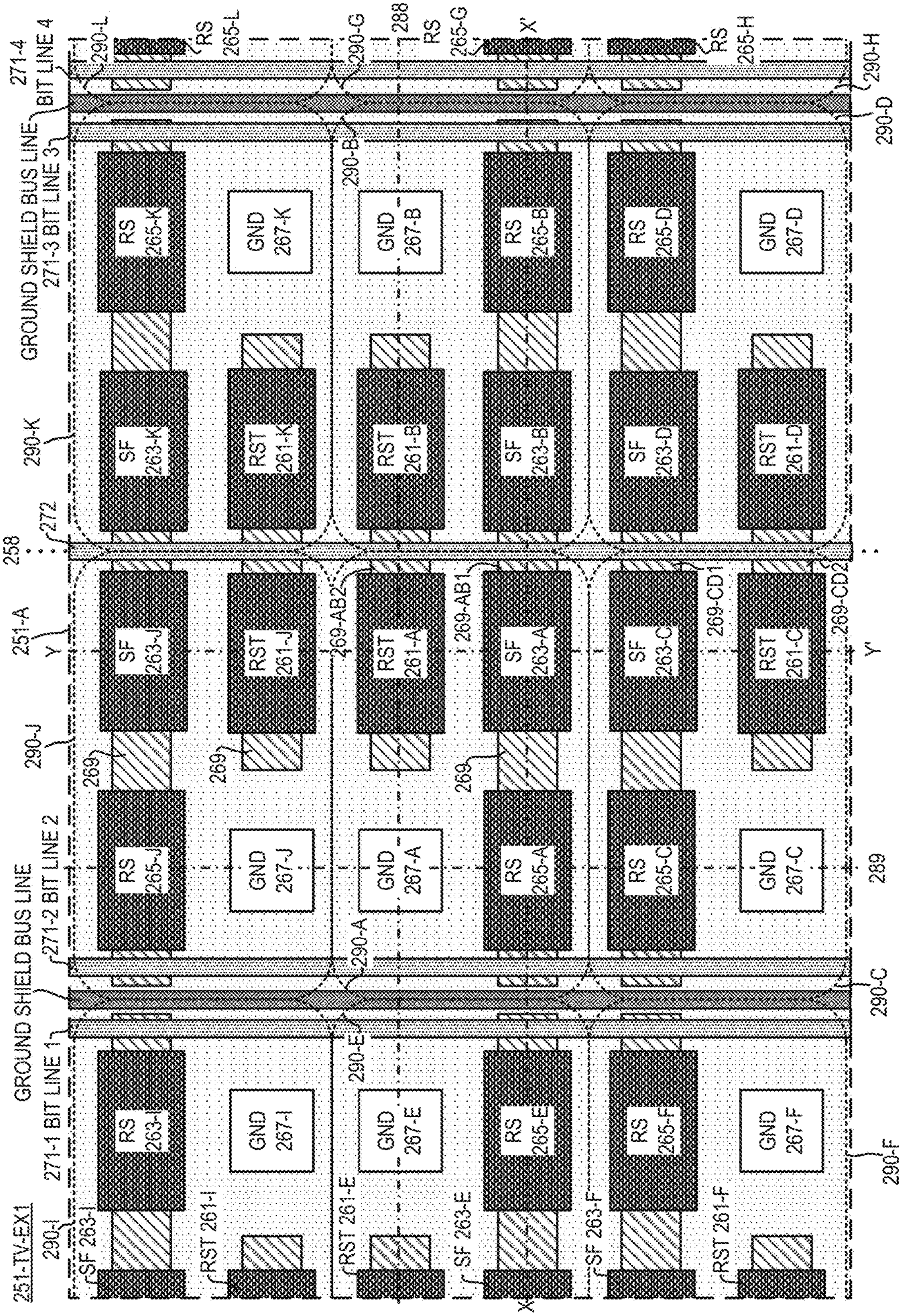
FIG. 2I illustrates an expanded top view of the second semiconductor substrate included in the example imaging system of FIG. 2A, in accordance with embodiments of the present disclosure.
Figure 2J:
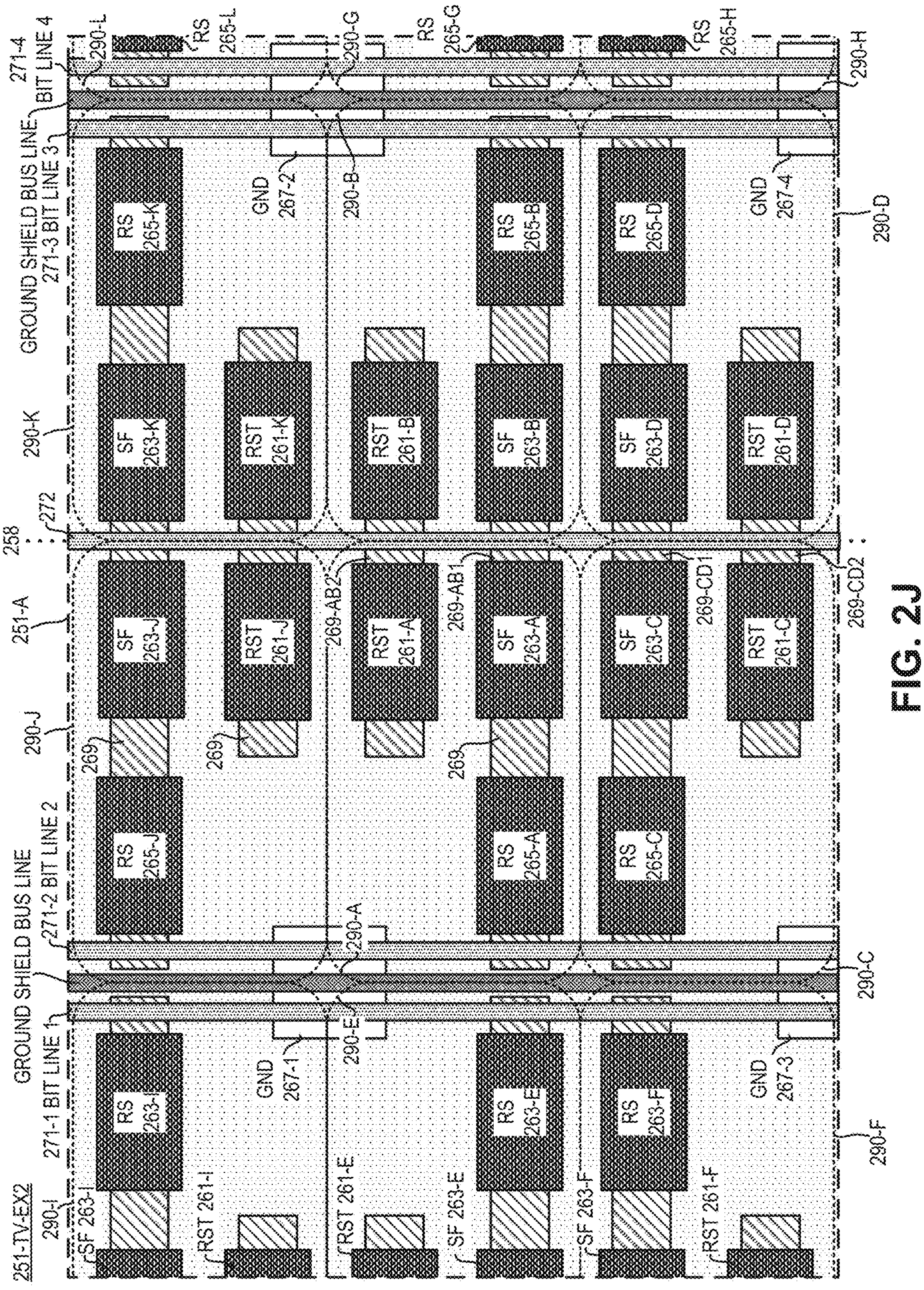
FIG. 2J illustrates an expanded top view of the second semiconductor substrate included in the example imaging system of FIG. 2A in an embodiment where ground contact regions are shared, in accordance with embodiments of the present disclosure.
Figure 2K:
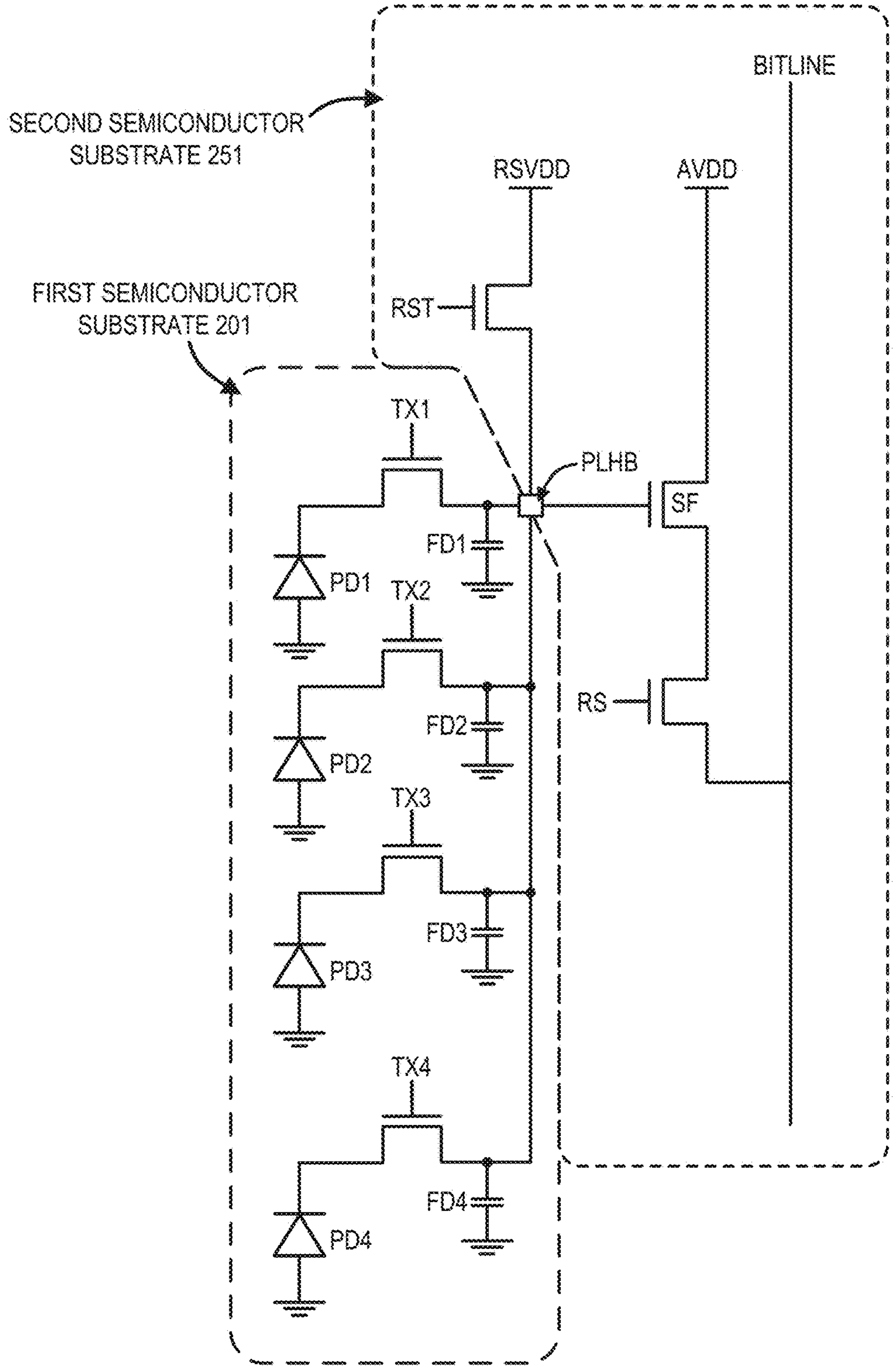
FIG. 2K is a schematic diagram of a pixel cell included in the example imaging system of FIG. 2A, in accordance with embodiments of the present disclosure.

It is appreciated that respective elements of the plurality of transfer gates 220, the plurality of floating diffusion regions 221, the plurality of isolation regions 222, and the plurality of ground contact regions 223 are each disposed within or on the first semiconductor substrate 201 and arranged within each pixel included in the plurality of pixel cells 205 in a specific manner to enable reduced pixel pitch, ensure compatibility with the associated pixel cell circuitry coupled thereto (e.g., as illustrated in FIG. 2A, FIG. 2B, and FIG. 2K), and mitigate performance variance due to process variation during fabrication. For example, the first floating diffusion region 221-1, the first isolation region 222-1, and the first ground contact region 223-1 are disposed proximate to the first transfer gate 220-1 of the first pixel 210-1. Specifically, the first floating diffusion region 221-1, the first isolation region 222-1, and the first ground contact region 223-1 are aligned with a common edge of the first transfer gate 220-1. Additionally, the first isolation region 222-1 is disposed between the first ground contact region 223-1 and the first floating diffusion region 221-1. It is appreciated that a similar arrangement of elements that is mirrored (i.e., reflected) about an axis (e.g., axis 249 and 248 with respect to the first pixel 210-1) also applies to other pixels included in the plurality of pixels 210 as illustrated in FIG. 2C.

It is further appreciated that the plurality of transfer gates 220 each include one of planar regions 224 (e.g., first planar region 224-1, second planar region 224-2, third planar region 224-3, fourth planar region 224-4, or so on) and one of vertical regions 225 (e.g., first vertical region 225-1, second vertical region 225-2, third vertical region 225-3, fourth vertical region 225-4, or so on) to collectively form an individual one of the plurality of transfer gates 220. As illustrated in FIG. 2C and FIG. 2D, the vertical regions 225 extend from a respective one of the planar regions 224 (e.g., first vertical region 225-1 extends from first planar region 224-1 to form the first transfer gate 220-1) into the first semiconductor substrate 201 proximate to the coupled floating diffusion region 221 of a respective pixel included in the plurality of pixels 210 (e.g., first floating diffusion region 221-1 coupled to the first transfer gate 220-1 for the first pixel 210-1). In the illustrated embodiment of FIG. 2C, the vertical regions 225 are not viewable from the top view 210-TV. However, to facilitate discussion of the illustrated embodiment, a dashed line is shown to represent the position of the vertical regions 225 that extend into the first semiconductor substrate 201 from the planar regions 224 (e.g., as illustrated in FIG. 2D). As illustrated, the vertical regions 225 are each disposed proximate to a corresponding one of the plurality of floating diffusion regions 221 of the pixel cell. In some embodiments, the plurality of isolation regions 222 may each be formed of doped regions having an opposite conductivity type to an adjacent photodiode and floating diffusion region included in the plurality of floating diffusion regions 221. Additionally, each element has a pre-determined lateral area, within manufacturing tolerances appropriate for the utilized fabrication technology node. In some embodiments, the pre-determined lateral area of each of the plurality of floating diffusion regions 221, the plurality of isolation regions 222, and the plurality of ground contact regions 223 are substantially equivalent (e.g., within 10% or less). In other embodiments, the pre-determined lateral areas of each of the plurality of floating diffusion regions 221, plurality of isolation regions 222, and the plurality of ground contact regions 223 are different. Additionally, the center of each of the plurality of pixels 210 are separated from an adjacent one of the plurality of pixels 210 by a pitch pixel, which may be uniform throughout the plurality of pixels 210.

In the illustrated embodiment of FIG. 2C, the first pixel 210-1, the second pixel 210-2, the third pixel 210-3, and the fourth pixel 210-4 are arranged in rows and columns to collectively form a two-by-two pixel array corresponding to the first pixel cell 205-1. For example, the first pixel 210-1 and the second pixel 210-2 are in a first row included in the rows while the third pixel 210-3 and the fourth pixel 210-4 are in a second row included in the rows. Similarly, the first pixel 210-1 and the third pixel 210-3 are in a first column included in the columns and the second pixel 210-2 and the fourth pixel 210-4 are in a second column included in the columns. It is further appreciated that the first pixel 210-1 is adjacent to the second pixel 210-2 and the third pixel 210-3 such that there are no intervening pixels disposed between the first 210-1 and the second pixel 210-2 or the first pixel 210-1 and the third pixel 210-3. As illustrated, first pixel cell 205-1 is mirror symmetric about axis 248 and axis 249. In other words, elements of the first pixel cell 205-1 are arranged such that there is reflective symmetry about the axis 248 and the axis 249. It is further noted that in the illustrated embodiment, the axis 248 is orthogonal to the axis 249. It is appreciated that the mirror symmetry facilitates coupling elements included in adjacent pixels for a given pixel cell and/or adjacent pixel cells (see, e.g., FIG. 2K in which the floating diffusion regions for a given pixel cell are coupled to one another and subsequently coupled to one of the individual groups of components of the pixel cell circuitry). However, in other embodiments, axis 248 and axis 249 may not be orthogonal to one another, or there may be additional or different axes about which the pixel cell is mirror symmetric.

FIG. 2D illustrates a cross-sectional view 201-AA' of the first semiconductor substrate 201 along the line A-A' shown in FIG. 2C, in accordance with embodiments of the present disclosure. The cross-sectional view 201-AA' includes a first pinning region 207-1, a third pinning region 207-3, a first doped region 209-1, a third doped region 209-3, a first deep doped region 212-1, a third deep doped region 212-3, the DTI structure 215 including an inner region 216, and an outer region 217, the first floating diffusion region 221-1, the third floating diffusion region 221-3, a first well 234-1, and a third well 234-3, each disposed between the first side 202 and the second side 203 of the first semiconductor substrate 201. A gate oxide (e.g., an oxide layer 226) is disposed proximate to the first side 202 of the first semiconductor substrate 201. The cross-sectional view 201-AA' further includes the first transfer gate 220-1 including a first planar region 224-1 and a first vertical region 225-1, the third transfer gate 220-3 including a third planar region 224-3 and a third vertical region 225-3, and an axis 247-AA'. It is appreciated that elements are hyphenated with a "1" or a "3" to indicate respective association with the first pixel 210-1 or the third pixel 210-3. For example, the first pinning region 207-1, the first doped region 209-1, the first deep doped region 212-1, the first transfer gate 220-1 including the first planar region 224-1 and the first vertical region 225-1, the first floating diffusion region 221-1, and the first well 234-1 are all included in the first pixel 210-1.

As illustrated the DTI structure 215 extends an isolation depth into the first semiconductor substrate 201 from the first side toward the second side 203 of the first semiconductor substrate 201. The DTI structure 215 separates the first pixel 210-1 from the third pixel 210-3, which is adjacent to the first pixel 210-1. In some embodiments, the isolation depth of the DTI structure 215 may be greater than 1 μm but less than or equal to a substrate thickness (e.g., 2.5 μm to 7 μm) of the first semiconductor substrate 201. In the same or other embodiments, there may exist at least a 1 μm thick region of the first semiconductor substrate 201 disposed between the second side 203 of the first semiconductor substrate 201 and the DTI structure 215. As discussed previously, the DTI structure 215 provides both physical separation and electrical isolation for adjacent pixels included in the plurality of pixels 210. The DTI structure 215 may also provide optical isolation between first pixel 210-1 and the third pixel 210-3. In some embodiments, the DTI structure 215 is a monolithic structure with a uniform composition (e.g., an oxide material such as silicon dioxide, a dielectric material having refractive index lower than the first semiconductor substrate 201, or a different insulating material). In the illustrated embodiment, the DTI structure 215 includes the inner region 216 (e.g., formed of polycrystalline silicon, a metal such as tungsten or aluminum, an insulating material with a refractive index lower than a corresponding refractive index of the first semiconductor substrate 201, or an oxide material such as silicon dioxide) that is surrounded by the outer region 217 (e.g., an insulating material such as silicon dioxide, or high k material such as aluminum oxide, hafnium oxide, tantalum oxide, zirconium oxide, or other material). It is appreciated that in some embodiments the DTI structure 215 may correspond to an attenuation layer that may reflect, absorb, diffract, or otherwise impede electrical and/or optical crosstalk between adjacent pixels included in the plurality of pixels 210.

In the illustrated embodiment, the first pixel 210-1 and the third pixel 210-3 each include a respective photodiode included in a plurality of photodiodes 204 (see, e.g., FIG. 2B). For example, the first pinning region 207-1, the first doped region 209-1, and the first deep doped region 212-1 in combination with the first semiconductor substrate 201 collectively form a pinned photodiode corresponding to the first photodiode 204-1 of the first pixel 210-1 illustrated in FIG. 2B, which may be representative of any or each other photodiode included in the plurality of photodiodes 204. In some embodiments, each of the first pinning region 207-1 and the third pinning region 207-3 may be coupled to a ground. Referring back to FIG. 2D, it is appreciated that the first pinning region 207-1 and the first deep doped region 212-1 may be optional elements (e.g., in an embodiment where the first photodiode 204-1 of FIG. 2B is not a pinned photodiode). As illustrated, the first pinning region 207-1 and the third pinning region 207-3 are each disposed proximate to the first side 202 of the first semiconductor substrate 201 to provide surface passivation. In the illustrated embodiment, the first pinning region 207-1 is disposed between the first side 202 of the first semiconductor substrate 201 and the first doped region 209-1 and the third pinning region 207-3 is disposed between the first side 202 of the first semiconductor substrate 201 and the third doped region 209-3. In some embodiments, the first doped region 209-1, the third doped region 209-3, the first deep doped region 212-1, and the third deep doped region 212-3 are each a first conductivity type (e.g., N-type or P-type electrical conductivity) while the first semiconductor substrate 201, the first pinning region 207-1, and the third pinning region 207-3 are each a second conductivity type (e.g., P-type or N-type electrical conductivity) opposite of the first conductivity type. It is appreciated that in some embodiments a first doping concentration of the doped regions (e.g., the first doped region 209-1 and/or the third doped region 209-3) is different than a second doping concentration of the deep doped regions (e.g., the first deep doped region 212-1 and/or the third deep doped region 212-1). In some embodiments, the doping concentration of the first pinning region 207-1 or the third pinning region 207-3 is configured to be greater than the doping concentration of the first semiconductor substrate 201.

As illustrated in FIG. 2D, the first transfer gate 220-1, the third transfer gate 220-3, the first floating diffusion region 221-1, and the third floating diffusion region 221-3 are each disposed proximate to the first side 202 of the first semiconductor substrate 201. Each of the plurality of transfer gates 220 include a respective planar region electrically coupled to a vertical region (e.g., the first transfer gate 220-1 includes the first planar region 224-1 coupled to the first vertical region 225-1 and the third transfer gate 220-3 includes the third planar region 224-3 coupled to the third vertical region 225-3). For example, the first vertical region 225-1 extends from the first planar region 224-1 of the first transfer gate 220-1 into the first semiconductor substrate 201 towards the second side 203 of the first semiconductor substrate 201. Disposed between the plurality of transfer gates 220 and the plurality of photodiodes (e.g., the plurality of pinning regions 207, the plurality of doped regions 209, and the plurality of deep doped regions 212) is the oxide layer 226, which provides an insulating barrier (e.g., to form a plurality of transfer transistors). In some embodiments the oxide layer 226 is silicon dioxide, hafnium oxide, aluminum oxide, or any other insulating material with suitable properties for forming the plurality of transfer transistors.

It is appreciated that the first side 202 of the first semiconductor substrate 201 is disposed between the first planar region 224-1 and the underlying photodiode of the first pixel 210-1 (e.g., the first doped region 209-1 as well as the first pinning region 207-1 and the first deep doped region 212-1). Additionally, the first vertical region 225-1 of the first transfer gate 220-1 is disposed between the first pinning region 207-1 and the first floating diffusion region 221-1 of the first pixel 210-1. The first vertical region 225-1 of the first transfer gate 220-1 is also partially disposed between the first doped region 209-1 and the first well 234-1. In the illustrated embodiment, the first vertical region 225-1 of the first transfer gate 220-1 is also disposed between the first planar region 224-1 of the first transfer gate 220-1 and the first doped region 209-1. Additionally, the first vertical region 225-1 is disposed between the first doped region 209-1 and the first floating diffusion region 221-1 of the first pixel 210-1. The first well 234-1 and third well 234-3 are disposed between an adjacent photodiode (e.g., the first doped region 209-1 and the first deep doped region 212-1 of the first pixel 210-1 or the third doped region 209-3 and the third deep doped region 212-3 of the third pixel 210-3) and the DTI structure 215 (i.e., a portion of the DTI structure 215 that is disposed between first pixel 210-1 and first pixel 210-3). In some embodiments, the first floating diffusion region 221-1 of the first pixel 210-1 is disposed in the first well 234-1 and the third floating diffusion region 221-3 is disposed in the third well 234-3. In some embodiments, the first well 234-1 corresponds to a doped well region having an opposite conductivity type relative to a conductivity type of the first doped region 209-1, the first deep doped region 212-1, and/or the first floating diffusion region 221-1 of the first pixel 210-1. In the same or other embodiments, the third well 234-3 corresponds to a doped well region having an opposite conductivity type relative to a conductivity type of the third doped region 209-3, the third deep doped region 212-3, and/or the third floating diffusion region 221-3 of the third pixel 210-3.

To facilitate reduced pixel pitch and performance variance due to processing variation, the structure of the plurality of pixels 210 is further configured such that the planar region (e.g., the first planar region 224-1 and the third planar region 224-3) laterally extends over the underlying photodiode (e.g., any one or more of the first pinning region 207-1, the first doped region 209-1, and/or the first deep doped region 212-1 for the first pixel 210-1) to protect the underlying photodiode from contamination and/or damage during processing steps subsequent to the formation of the underlying photodiode on the first side 202 of the first semiconductor substrate 201. Accordingly, the transfer gate associated with the underlying photodiode (e.g., the first transfer gate 220-1 in the case of the first pixel 210-1) is optically aligned with the underlying photodiode (e.g., any one or more of the first pinning region 207-1, the first doped region 209-1, and/or the first deep doped region 212-1 for the first pixel 210-1) such that the planar region (e.g., the first planar region 224-1 for the first pixel 210-1) of the transfer gate laterally extends over the underly photodiode to cover an entirety of a lateral area of the underlying photodiode when the first semiconductor substrate 201 is viewed from the first side 202 (e.g., as shown in FIG. 2C, the underlying photodiodes do not extend beyond the lateral area covered by the plurality of transfer gates 220 and thus are not visible in the top view 201-TV). In some embodiments, the lateral area of the underlying photodiode is less than or equal to a lateral area of the planar region of the transfer gate. For example, in one embodiment, a lateral area of the first doped region 209-1 is less than or equal to a lateral of the first planar region 224-1 of the first transfer gate 220-1. In the illustrated embodiment, the lateral area of the first doped region 209-1 is based on a width 229 of the first doped region 209-1 and a length of the first doped region 209-1 while the lateral area of the first planar region 224-1 of the first transfer gate is based on a width 227 of the first planar region 224-1 and a length of the first planar region 224-1. Thus, in some embodiments the width 229 of the first doped region 209-1 is less than or equal to the width 227 of the first planar region 224-1 of the first transfer gate 220-1. In the same or other embodiments, the length of the first doped region 209-1 is less than or equal to the length of the first planar region 224-1 of the first transfer gate 220-1. Consequently, the first planar region 224-1 of the first transfer gate 220-1 extends over the first doped region 209-1 to cover an entirety of the lateral area of the first doped region 209-1 when the first semiconductor substrate 201 is viewed from the first side 202. It is further appreciated that the first pixel 210-1 is mirror symmetric to the third pixel 210-3 about the axis 247-AA'. In other words, in some embodiments there is reflective symmetry through the first semiconductor substrate 201 about the axis 247-AA', which is orthogonal to both the axis 248 and the axis 249 illustrated in FIG. 2C. FIG. 2E illustrates a top view of a second semiconductor substrate included in the example imaging system of FIG. 2A, in accordance with embodiments of the present disclosure.

FIG. 2E illustrates a top view 251-TV of the second semiconductor substrate 251 included in the example imaging system 200 of FIG. 2A, in accordance with embodiments of the present disclosure. Specifically, the top view 251-TV shows the pixel cell circuitry 255 for operation of the plurality of pixel cells 205 illustrated in FIG. 2A. Referring back to FIG. 2A, it can be seen that the plurality of pixel cells 205 and the pixel cell circuitry 255 are each arranged in rows (e.g., R1, R2, R3, RY) and columns (e.g., C1, C2, C3, CX). It is appreciated that when the first semiconductor substrate 201 and the second semiconductor substrate 251 form a stacked structure, the rows and columns are aligned (e.g., a pixel cell included in the plurality of pixel cells positioned in R1 and C1 is aligned, at least partially, over a group of components included in the pixel cell circuitry 255 positioned in R1 and C1). Accordingly, the structure of the pixel cell circuitry 255 is configured to facilitate appropriate operation of the plurality of pixel cells 205 to enable reduced pixel pitch while mitigating performance variance due to processing variation during fabrication.

As illustrated in FIG. 2E, the pixel cell circuitry 255 includes a plurality of reset gates 261, a plurality of source-follower gates 263, a plurality of row select gates 265, a plurality of ground contact regions 267, and source/drain regions 269 (including shared source/drain regions 269-AB1, 269-AB2, 269-CD1, and 269-CD2) disposed in or on the second semiconductor substrate 251 (i.e., proximate to a first side of the second semiconductor substrate 251). It is appreciated that the plurality of reset gates 261, the plurality of source-follower gates 263, the plurality of row select gates 265, and the source/drain regions 269 respectively form reset transistors, source-follower transistors, and row select transistors of the pixel cell circuitry 255 for operation of the plurality of pixel cells 205 illustrated in FIG. 2A. The top view 251-TV also illustrates a power rail 272 disposed between bit lines 271 of the imaging system 200.

In the illustrated embodiment of FIG. 2E, the pixel cell circuitry 255 includes an arrangement of individual groups of components 290 (e.g., a first group of components 290-A, a second group of components 290-B, a third group of components 290-C, and a fourth group of components 290-D) that are associated with a respective one of the plurality of pixel cells 205 illustrated in FIG. 2A. In other words, each of the individual groups of components 290 of the pixel cell circuitry 255 is associated with a respective row and column as illustrated in FIG. 2A (e.g., the first group of components 290-A of FIG. 2E may be associated with row R1 and column C1 and facilitate operation of the pixel cell located in row R1 and column C1 included in the plurality of pixel cells 205 illustrated in FIG. 2A). It is further appreciated that the individual groups of components 290 illustrated in the pixel cell circuitry 255 may represent a minimal repeat unit of the pixel cell circuitry 255 (e.g., multiple instances of the two-by-two arrangement of the first group of components 290-A, the second group of components 290-B, the third group of components 290C, and the fourth group of components 290-D may be included in the pixel cell circuitry 255 to match the number of pixel cells included in the plurality of pixel cells 205 illustrated in FIG. 2A).

As illustrated in FIG. 2E, the individual groups of components 290 each include a reset gate, a source-follower gate, a row-select gate, and a ground contact region (e.g., the first group of components 290-A includes reset gate 261-A, source-follower gate 263-A, row select gate 265-A, and ground contact region 267-A, the second group of components 290-B includes reset gate 261-B, source-follower gate

263-B, row select gate 265-B, and ground contact region 267-B, the third group of components 290-C includes reset gate 261-C, source-follower gate 263-C, row select gate 265-C, and ground contact region 267-C, and the fourth group of components 290-D includes reset gate 261-D, source-follower gate 263-D, row select gate 265-D, and ground contact region 267-D). In some embodiments, each of the individual groups of components 290 is aligned with a corresponding pixel cell region (e.g., the first group of components 290-A may be aligned and associated with the four pixels 210-1, 210-2, 210-3, and 210-4 included in the first pixel cell 205-1 illustrated in FIG. 2C) to form a stacked structure that is electrically coupled together (e.g., individual groups of components 290 disposed in the second semiconductor substrate 251 illustrated in FIG. 2E are electrically coupled to a respective one of the pixel cells included in the plurality of pixel cells 205 illustrated in FIG. 2A). For example, the second group of components 290-B may be aligned (e.g., in a vertical direction) and associated with another four pixels included in another pixel cell that may be disposed adjacent to or in the same row as the first pixel cell 205-1. In one embodiment, each of the source-follower gates 263 is coupled to a floating diffusion region (see, e.g., FIG. 2K) of a respective pixel cell included in the plurality of pixel cells 205 illustrated in FIG. 2A. In the same or other embodiments, the floating diffusion region of each pixel included in the respective pixel cell are coupled together (e.g., the first floating diffusion regions 221-1, the second floating diffusion region 221-2, the third floating diffusion 221-3, and the fourth floating diffusion region 221-4 of the first pixel cell 205-1 illustrated in FIG. 2C are coupled together) to be collectively coupled with a respective one of the source-follower gates 263 included in the pixel cell circuitry 255 (e.g., the source-follower gate 263-A illustrated in FIG. 2E or as illustrated in FIG. 2K).

Referring back to FIG. 2E, the pixel cell circuitry 255, or more specifically the arrangement of the individual groups of components 290 included in the pixel cell circuitry 255, is mirror symmetric about 258 and axis 259 (e.g., a first axis and a second axis, respectively). In other words, elements of the individual groups of components 290 (e.g., the first group of components 290-A, the second group of components 290-B, the third group of components 290-C, and the fourth group of components 290-D, which may collectively correspond to a minimal repeat unit of the pixel cell circuitry 255) are arranged such that there is reflective symmetry about the axis 258 and the axis 259. It is further noted that in the illustrated embodiment, the axis 258 is orthogonal to the axis 259. It is appreciated that the mirror symmetry of the pixel cell circuitry 255 enables fabrication of the pixel cell circuitry 255 with reduced performance variance due to processing variation even with decreasing pixel size and/or pixel pitch while meeting design rule requirements for a given semiconductor processing node. With such an arrangement of the individual groups of components 290, components of adjacent groups may share a common implantation window on an implantation mask (see, e.g., FIG. 4D), which enables a wider implantation window size even for pixel with a small size and/or pixel pitch, thereby allowing for improved implantation process control. For example, source-follower transistors of the first group of components 290-A and the second group of components 290-B (e.g., source-follower gate 263-A and source-follower gate 263-B or other components of the source-follower transistors such as threshold voltage adjustment regions, source/drain regions, or otherwise) can share the same implantation window of one or more implantation masks during the implantation process (e.g., for threshold voltage adjustment implantation, source/drain implantation, and/or shared junction implantation). In the same or other embodiments, source-follower transistors of the first group of components 290-A, the second group of components 290-B, the third group of components 290-C, and the fourth group of components 290-D (e.g., the source-follower gate 263-A, the source-follower gate 263-B, the source-follower gate 263-C, and the source-follower gate 263-D) may all share the same implantation window on one or more implantation masks. Similarly, reset transistors of the first group of components 290-A and the second group of components 290-B (e.g., the reset gate 261-A and the reset gate 261-B) may share same implantation window on implantation masks during implantation process such as threshold adjustment implantation or source/drain implantation. It is further appreciated that the not all combinations of potential shared implantation windows are explicitly described herein. However, one of ordinary skill in the art will understand that one of the advantageous effects of embodiments of the disclosure enables adjacent elements of a common name (e.g., voltage threshold adjustment regions, junction regions, source/drain regions, or other elements) that are adjacent to one other but may be separated by one or more intervening elements (e.g., gate electrodes such as reset gates, source-follower gates, or row select gates, isolation structures such as shallow trench isolation structures or deep trench isolation structures, other elements, or combinations thereof) may share implantation windows.

Additionally, the structure and arrangement of the pixel cell circuitry 255 of the second semiconductor substrate 251 enables, at least in part, the reduced pixel pitch of the plurality of pixel cells 205 included in the first semiconductor substrate 201 illustrated in FIG. 2A. It is appreciated that in some embodiments, the axis 258 and axis 259 may not be orthogonal to one another, or there may be additional or different axes about which the pixel cell circuitry 255, or more specifically the arrangement of the individual groups of components 290, is mirror symmetric. For example, in some embodiments, the arrangement of the individual groups of components 290 included in the pixel cell circuitry 255 is mirror symmetric about a diagonal axis extending between the axis 258 and the axis 259. In some embodiments, the diagonal axis may correspond to one or more axes that are approximately 45° (e.g., within 10%) between the axis 258 and the axis 259. Additionally, it is noted that in the illustrated embodiment, the axis 258 is parallel with at least one of a power rail (e.g., power rail 272) or a bit line (e.g., bit line 271) of the image sensor (e.g., the imaging system 200 as illustrated in FIG. 2A). Furthermore, the axis 259 is orthogonal with at least one of a power rail (e.g., power rail 272) or a bit line (e.g., bit line 271) of the image sensor (e.g., the imaging system 200 as illustrated in FIG. 2A).

As illustrated in FIG. 2E, the individual groups of components 290 of the pixel cell circuitry 255 are arranged in or on respective portions of the second semiconductor substrate 251 to form a pixel circuitry array. It is appreciated that the respective portions of the semiconductor substrate 251 are aligned with or otherwise correspond to the dotted line segmenting the individual groups of components 290, which are arranged in rows (e.g., row X and row Y) and columns (e.g., column X and column Y) such that an adjacent set of four of the individual groups of components 290 (e.g., the first group of components 290-A, the second group of components 290-B, the third group of components 290-C, and the fourth group of components 290-D) span two adjacent rows included in the rows and two adjacent columns included in the columns. It is appreciated that in some embodiments the rows and columns of second semiconductor substrate 251 may correspond to the rows and column arrangement of the associated pixels and/or pixel cells on the first semiconductor substrate 201 (see, e.g., FIG. 2A). In some embodiments, the adjacent set of four of the individual groups of components 290 collectively form pixel transistors for a full-color image pixel of the image sensor. In other words, the first group of components 290-A, the second group of components 290-B, the third group of components 290-C, and the fourth group of components 290-D may respectively be coupled to a two-by-two group of pixel cells included in the plurality of pixel cells 205 illustrated in FIG. 2A that have an appropriate color filter pattern to form a full color image pixel (e.g., a red color filter, a blue color filter, and two green color filters for a first example full color image pixel or a red color filter, a blue color filter, a green color filter, and an infrared or non-visible color filter for a second example full color image pixel).

In the same or other embodiments, the individual groups of components 290 illustrated in FIG. 2E includes a first group (e.g., the first group of components 290-A), a second group (e.g., the second group of components 290-B), a third group (e.g., the third group of components 290-C), and a fourth group (e.g., the fourth group of components 290-D) arranged adjacently to form a two-by-two array included in the individual groups of components 290. It is appreciated that in the illustrated embodiment the first group is adjacent to the second group and the third group is adjacent to the fourth group. Additionally, the source-follower gate and the row select gate of both the first group (e.g., source-follower gate 263-A and row select gate 265-A) and the second group (e.g., source-follower gate 263-B and row select gate 265-B) are arranged along a first direction (e.g., corresponding to line X-X') while the source-follower gate and the row select gate of the third group (e.g., source-follower gate 263-C and row select gate 265-C) and the fourth group (e.g., source-follower gate 263-D and row select gate 265-D) are aligned along a second direction (e.g., corresponding to line 262) separated from, but parallel to, the first direction. In the illustrated embodiment, the first direction and the second direction are orthogonal to the axis 258. Similarly, the source-follower gate and the reset gate of both the first group (e.g., source-follower gate 263-A and reset gate 261-A) and the third group (e.g., source-follower gate 263-C and reset gate 261-C) are arranged along a third direction (e.g., corresponding to line Y-Y') while the ground contact region and the row select gate of the first group (e.g., ground contact region 267-A and row select gate 265-A) and the third group (e.g., ground contact region 267-C and row select gate 265-C) are aligned along a fourth direction (e.g., corresponding to line Z-Z') separated from, but parallel to, the third direction (e.g., corresponding to line Y-Y'). In the illustrated embodiment, the third direction and the fourth direction are orthogonal to the axis 259. Similarly, the source-follower gate and the reset gate of both the second group (e.g., source-follower gate 263-B and reset gate 261-B) and the fourth group (e.g., source-follower gate 263-D and reset gate 261-D) are arranged along a fifth direction (e.g., corresponding to line 282) that is separated from but parallel to the third direction (e.g., corresponding to line Y-Y') while the ground contact region and the row select gate of the second group (e.g., ground contact region 267-B and row select gate 265-B) and the fourth group (e.g., ground contact region 267-D and row select gate 265-D) are aligned along a sixth direction (e.g., corresponding to line 284) that is separated from but parallel to the fifth direction 282. FIG. 2F illustrates a cross-sectional view 251-XX' of the second semiconductor substrate 251 along line X-X' shown in FIG. 2E, in accordance with embodiments of the present disclosure. The cross-sectional view 251-XX' illustrates the first group of components 290-A and the second group of components 290-B included in the pixel cell circuitry 255, which shows source-follower gate 263-A, source-follower gate 263-B, row select gate 265-A, and row select gate 265-B disposed proximate to the first side 252 of the second semiconductor substrate 251. It is appreciated the second semiconductor substrate 251 includes a second side 253 opposite of the first side 252. Disposed between the transistor gates (e.g., source-follower gate 263-A, source-follower gate 263-B, row select gate 265-A, and row select gate 265-265-B) and the first side 252 of the second semiconductor substrate 251 is a dielectric 274 (e.g., a buffer oxide, a gate oxide, or other insulating material which may include or otherwise correspond to silicon dioxide). The source-follower gate 263-A, source-follower gate 263-B, row select gate 265-A, and row select gate 265-B either form a source-follower transistor or a row select transistor of the pixel cell circuitry 255 for a corresponding pixel cell, which is facilitated by the dielectric 274 and the source/drain regions 269. The source/drain regions 269 are doped regions (e.g., via ion implantation) of the second semiconductor substrate 251, which have a dopant density sufficient for the formation of a source or drain electrode of a transistor (e.g., heavily doped region) depending on the conductivity type and concentration of the second semiconductor substrate 251 or well 257 in which transistors are formed). It is appreciated that in some embodiments the source/drain regions 269 may be coupled to a lightly doped drain (not illustrated), which are doped regions (e.g., via ion implantation) extending from the source/drain regions 269 towards the dielectric 274. In the illustrated embodiment the threshold voltage of the row select and source-follower transistors may be modulated (e.g., increased) via threshold voltage adjustment regions 275 and 277, which are doped regions (e.g., via ion implantation) respectively associated with the source-follower transistors and the row select transistors.

It is appreciated that the threshold voltage adjustment regions 275 and 277 may be disposed proximate to respective channel regions associated with source-follower transistors and the row select transistors to influence the threshold voltage of a corresponding transistor. In some embodiments, the threshold voltage adjustment regions 275 under source-follower gates 263-A and 263-B are a common doped region (e.g., the threshold voltage adjustment regions 275 may extend laterally along a channel direction from an active region of the source-follower transistor in the first group of components 290-A and, at least in part, extend over to the active region of the source-follower transistor in the second group of components 290-B). In other words, threshold voltage adjustment region 275 may be shared by both the source-follower transistor in the first group of components 290-A and the source-follower transistor in the second group of components 290-B. Similarly, instances of the threshold voltage adjustment region 277 are formed proximate to channel regions under the row select gate 265-A of the row select transistor in the first group of components 290-A and proximate to a channel region under the row select gate 265-B of the row select transistor in the second group of components 290-B. In some embodiments, the threshold voltage adjustment regions 275 and 277 may each form at a depth proximate to respective channel regions and shallower than each of a junction depth associated with source/drain regions 269 of a respective transistor. In some embodiments, an extended region depth that each of the threshold voltage adjustment regions 275 and 277 is less than an extended depth of the shallow trench isolation structures 273. In some embodiments the junction depth of the source/drain regions 269 is between 10 nm and 40 nm. In other embodiments the junction depth of the source/drain region is more than 40 nm. In some embodiments the threshold voltage adjustment regions 275 and/or 277 extend from (or are otherwise proximate to) the first side 252 of the second semiconductor substrate 251 towards the second side 253 without exceeding the junction depth of the source/drain regions 269. In the same or other embodiments, the threshold voltage adjustment regions 275 and/or 277 may overlap a part of associated source/drain regions 269 (e.g., the threshold voltage adjustment regions 275 and/or 277 may extend under one or more of the source/drain regions 269).

In some embodiments, shallow trench isolation structures 273 (e.g., a dielectric material such as silicon dioxide) may be disposed proximate to the bit lines 271 to separate adjacent pairs of the individual groups of components 290. It is appreciated that the degree of threshold voltage adjustment may be based, at least in part, on the conductivity type of the dopant used (e.g., P-type or N-type) and the concentration of the dopant. In the illustrated embodiment, the source/drain regions 267, the threshold voltage adjustment regions 275 and 277, and the shallow trench isolation structures 273 are each disposed in the well 257, which may a doped portion of the second semiconductor substrate 251 (e.g., a P-well or an N-well). In one embodiment, the individual groups of components 290 included in the pixel cell circuitry 255 are mirror symmetric about axis 264 (e.g., the first group of components 290-A and the second group of components 290-B are arranged such that there is reflective symmetry about axis 264).

In some embodiments, the arrangement of the individual groups of components 290 included in the pixel cell circuitry 255 facilitates a reduction in component size such that the first group of components 290-A and the second group of components 290-B span less than or approximately equal to 1 μm, less than or approximately equal to 0.8 μm, or otherwise while maintaining minimum feature sizes sufficient with the chosen semiconductor processing node (e.g., 45 nm). Additionally, it is noted that the source/drain regions 269 may be coupled to the bit lines 271, the power rail 272, and/or gate electrodes (e.g., SF 263-A, SF 263-B, RS 265-A, RS 265-B, and so on) through respective contacts. Advantageously, the mirror symmetry of the pixel cell circuitry enables a common junction region of the second semiconductor substrate 251 to be shared by components of different pixels and/or pixel cells, which may improve substrate space efficiency and utilization. For example, in the illustrated embodiment, the source-follower transistor of the first group of components 290-A and the source-follower transistor of the second group of components 290-B may share a common source/drain junction region. For example, the source-follower gate 263-A of the first group of components 290-A and the source-follower gate 263-B of the second group of components 290-B are both coupled to source/drain region 269-AB1 to receive a supply voltage (e.g., AVDD) from the power rail 272. Similarly, and referring back to FIG. 2E, the source-follower gate 263-C of the third group of components 290-C and the source-follower gate 263-D of the fourth group of components 290-D are both coupled to a shared source/drain region (e.g., 269-CD1) included in the source/drain regions 269 to also receive the supply voltage from the power rail 272. Similarly, the reset transistor of the first group of components 290-A and the reset transistor of the second group of components 290-B may also share a common source/drain junction region. For example, and as illustrated in FIG. 2E, the reset gate 261-A of the first group of components 290-A and the reset gate 261-B of the second group of components 290-B are coupled to a shared source/drain region (e.g., 269-AB2) included in the source/drain regions 269 to receive a supply voltage from the power rail 272. Additionally, the reset gate 261-C of the third group of components 290-C and the reset gate 261-D of the fourth group of components 290-D are coupled to a shared source/drain region (e.g., 269-CD2) to receive a supply voltage from the power rail 272. It is appreciated that in some embodiments, a shared source/drain region (e.g., any of 269-AB1, 269-AB2, 269-CD1, 269-CD2, or any other shared source/drain regions included in the plurality of source drain regions 269 that are not explicitly labeled) may be more generally referred to as a "shared" or "common" junction region to indicate that an implanted electrode may be shared by more than one transistors (e.g., shared sources or shared drains) that may further be coupled to additional elements (e.g., one or more of the bit lines 271 and/or power rails 272).

It is further noted that an arrangement of the plurality of reset gates 261, the plurality of source-follower gates 263, the plurality of row select gates 265, and the plurality of ground contact regions 267 of the individual groups of components 290 illustrated in at least FIG. 2E yield the mirror symmetry of the pixel cell circuitry 255 disposed on the semiconductor substrate 251. For example, the first group of components 290-A, the second group of components 290-B, the third group of components 290-C, and the fourth group of components 290-D are arranged adjacently to form a two-by-two array (e.g., including rows X and Y and columns X and Y as illustrated in FIG. 2E). Accordingly, the source-follower gate 263-A of the first group of components 290-A is positioned adjacent to both the source-follower gate 263-B of the second group of components 290-B and the source-follower gate 263-C of the third group of components 290-C. The source-follower gate 263-A of the first group of components 290-A, and the source-follower gate 263-B of the second group of components 290-B are arranged along the first direction (e.g., corresponding to line X-X'), while the source-follower gate 263-A of the first group of components 290-A, and the source-follower gate 263-C of the third group of components 290-C are arranged along the third direction (e.g., corresponding to line Y-Y'). Similarly, the source-follower gate 263-D of the fourth group of components 290-D is positioned adjacent to both the source-follower gate 263-B of the second group of components 290-B and the source-follower gate 263-C of the third group of components 290-C. The source-follower gate 263-D of the fourth group of components 290-D and the source-follower gate 263-B of the second group of components 290-B are arranged along the fifth direction (e.g., corresponding to line 282) that is separated from but parallel to the third direction (e.g., corresponding to line Y-Y'), while the source-follower gate 263-D of the fourth group of components 290-D and the source-follower gate 263-C of the third group of components 290-C are arranged the second direction (e.g., corresponding to line 262) that is separated from, but parallel to, the first direction (e.g., corresponding to line X-X').

Additionally, the reset gate 261-A of the first group of components 290-A is positioned adjacent to the reset gate 261-B of the second group of components 290-B while the rest gate 261-C of the third group of components 290-C is positioned adjacent to the rest gate 261-D of the fourth group of components 290-D. Furthermore, the row select gate 265-A of the first group of components 290-A is positioned adjacent to the row select gate 265-C of the third group of components 290-C while the row select gate 265-B of the second group of components 290-B is positioned adjacent to the row select gate 265-D of the fourth group of components 290-D.

It is appreciated that the term "adjacent" or "positioned adjacent" in the context of the arrangement of the individual groups of components 290 may mean there is no intervening gate (included in the individual groups of components 290) between the adjacent components. For example, there is no intervening gate (e.g., amongst the plurality of reset gates 261, the plurality of source-follower gates 263, and the plurality or row select gates 265) between the source-follower gate 263-A disposed adjacent to the source-follower gate 263-B. Accordingly, it is appreciated that the mirror symmetry about axis 258 and axis 259 form a two-by-two array of source-follower gates (i.e., source-follower gates 263-A, 263-B, 263-C, and 263-D) that do not have any intervening gate electrodes associated with the reset transistor or row select transistors included in the pixel cell circuitry 255. In other words, the source-follower gates 263-A, 263-B, 263-C, and 263-D are adjacent to one another. It is further appreciated that in some embodiments there may be an isolation structure (e.g., DTI 215 illustrated in FIG. 2C, a shallow trench isolation structure such as shallow trench isolation structure 273 illustrated in FIG. 2F, or other isolation structure separating adjacent components) disposed between adjacent components included in the individual groups of components 290.

Referring back to FIG. 2F, the row select gates (e.g., RS 265-A, RS 265-B, and so on) may be coupled to a row select signal (e.g., provided by periphery circuitry 206 or 256 illustrated in FIG. 2A) for selective operation of a given pixel cell in a given row. The source-follower gates (e.g., SF 263-A, SF 263-B, and so on) may be coupled to a respective floating diffusion region included in the semiconductor substrate 251 (not illustrated) or the corresponding floating diffusion region 221 of the plurality of pixel cells 205 illustrated in FIG. 2C. It is appreciated that $FD_A$ and $FD_B$ illustrated in FIG. 2F represent a collective coupling to the floating diffusion regions of a given pixel cell (e.g., $FD_A$ may represent a coupling to the plurality of floating diffusion regions 221 in a first instance of the first pixel cell 205-1 illustrated in FIG. 2C while $FD_B$ may represent a coupling to the plurality of floating diffusion regions 221 in a second instance of the first pixel cell 205-1 illustrated in FIG. 2C). In some embodiments, the corresponding source drain regions included in the source/drain regions 269 for the row select transistor and the source-follower transistor of the first group of components 290-A and the source-follower transistor and the row select transistor of the second group of components 290-B are formed in a common doped well region having opposite conductivity to the source/drain region (e.g., well 257 have an opposite conductivity type than a corresponding conductivity type of the source/drain regions 269).

FIG. 2G illustrates a cross-sectional view 251-YY' of the second semiconductor substrate 251 along line Y-Y' shown in FIG. 2E, in accordance with embodiments of the present disclosure. The cross-sectional view 251-YY' illustrates a portion of the first group of components 290-A and the third group of components 290-C included in the pixel cell circuitry 255, which includes threshold voltage adjustment regions 275 (associated with the source-follower gates 263), threshold voltage adjustment regions 279 (associated with the reset gates 261), and shallow trench isolation structures 273 disposed in the well 257 formed in the second semiconductor substrate 251. As illustrated, one of the shallow trench isolation structures 273 is disposed between components of the first group of components 290-A and the third group of components 290-C. For example, shallow trench isolation structure 273-AC is disposed between the source-follower transistor and the row-select transistor of the first group of components 290-A and source-follower transistor and row-select transistor of the third group of components 290-C to provide isolation between group of components associated with pixel cells in different rows. The cross-sectional view 251-YY' further includes the source-follower gates 263 (e.g., SF 263-A and SF 263-C), the reset gates 261 (e.g., RST 261-A and RST 261-C) formed proximate to the dielectric 274 such that the dielectric 274 is disposed between the first side 252 of the second semiconductor substrate 251 and the gate electrodes (i.e., the source-follower gates 263 and/or the reset gates 261). As illustrated, the reset gates 261 are coupled to receive a reset signal $RST_{SIG}$, which may be output by periphery circuitry (e.g., periphery circuitry 206 and/or 256 illustrated in FIG. 2A), or other components of the imaging system. Threshold voltage adjustment regions 275 (associated with the source-follower gates 263) is disposed or formed proximate to channel region under the source-follower gates 263. Threshold voltage adjustment regions 275 (associated with the source-follower gates 263) may be disposed underneath the associated source/drain regions 269. Threshold voltage adjustment regions 279 (associated with the reset gates 261) is disposed or formed proximate to channel region under the reset gates 261. Threshold voltage adjustment regions 279 (associated with the reset gates 261) may be disposed underneath the associated source/drain regions 269. As discussed above, the source-follower gates 263 may be respectively coupled to a floating diffusion region of the second semiconductor substrate 251 and/or the floating diffusion regions of a given pixel cell, which are represented by $FD_A$ and $FD_C$. In one embodiment, the individual groups of components 290 included in the pixel cell circuitry 255 are mirror symmetric about axis 266 (e.g., the first group of components 290-A and the third group of components 290-C are arranged such that there is reflective symmetry about axis 266).

FIG. 2H illustrates a cross-sectional view 251-ZZ' of the second semiconductor substrate 251 along line Z-Z' shown in FIG. 2E, in accordance with embodiments of the present disclosure. The cross-sectional view 251-ZZ' illustrates a portion of the first group of components 290-A and the third group of components 290-C included in the pixel cell circuitry 255, which includes threshold voltage adjustment regions 277 (associated with the row select gates 263) disposed proximate channel regions under row select gates 263, heavily doped region 276 (associated with the ground contact regions 267), and shallow trench isolation structures 273 disposed in the well 257 formed in the second semiconductor substrate 251. Heavily doped region 276 may have same conductivity type as that of the second semiconductor substrate 251 (e.g., P-type) and have a dopant concentration greater than that a corresponding dopant concentration of the second semiconductor substrate 251. The cross-sectional view 251-ZZ' further includes the row select gates 265 (e.g., RS 265-A and RS 265-C), the ground contact regions 267 (e.g., GND 267-A and GND 267-C) formed proximate to the dielectric 274 (e.g., such that the dielectric 274 is disposed between the first side 252 of the second semiconductor substrate 251 and the ground contact regions 267). As illustrated, the row select gates 265 are coupled to receive a row select signal $RS_{SIG}$, which may be output by a control circuit included in periphery circuitry (e.g., periphery circuitry 206 and/or 256 illustrated in FIG. 2A), or other components of the imaging system. The heavily doped region 276 is coupled via a metal interconnect or contact to the ground contact regions 267, which may correspond to metal or polycrystalline silicon regions. It is appreciated that in some embodiments the ground contact regions 267 may be coupled to a ground or reference voltage. In some embodiments, ground contact regions 267 on the second semiconductor substrate 251 and ground contact regions 223 on the first semiconductor substrate 201 may be coupled together on a per pixel or per pixel cell basis to the same ground or reference voltage. In one embodiment, the individual groups of components 290 included in the pixel cell circuitry 255 are mirror symmetric about axis 268 (e.g., the first group of components 290-A and the third group of components 290-C are arranged such that there is reflective symmetry about axis 268).

It is appreciated that the views provided by FIG. 2G and FIG. 2H do not illustrate the plurality of source-drain regions 269 illustrated in other views (see, e.g., FIG. 2E and FIG. 2F). However, in some embodiments the implantation process may result in the plurality of source-drain regions 269 extending, at least partially, under respective gate electrodes (e.g., corresponding to any of the plurality of reset gates 261, the plurality of source-follower gates 263, or the plurality of row select gates 265). In other words, in some embodiments the interface where the plurality of source/drain regions 269 interfaces with a corresponding threshold voltage adjustment region (e.g., threshold voltage adjustment regions 275, 277, or 279) may occur under a corresponding one of the gate electrodes (e.g., the interface may be disposed between the corresponding one of the gate electrodes and the second side 253 of the second semiconductor substrate 251).

FIG. 2I illustrates an expanded top view 251-TV-EX1 of the second semiconductor substrate 251 included in the example imaging system 200 of FIG. 2A, in accordance with embodiments of the present disclosure. More specifically, the expanded top view 251-TV-EX1 is an expanded view of the top view 251-TV illustrated in FIG. 2E and includes many like-labeled elements. As illustrated in FIG. 2I, the expanded top view 251-TV-EX1 includes the individual groups of components 290 (e.g., 290-A, 290-B, 290-C, 290-D, 290-E, 290-F, 290-G, 290-H, 290-I, 290-J, 290-K, and 290-L), reset gates 261 (e.g., 261-A, 261-B, 261-C, 261-D, 261-E, 261-F, 261-I, 261-J, and 261-K), source-follower gates (e.g., 263-A, 263-B, 263-C, 263-D, 263-E, 263-F, 263-I, 263-J, and 263-K), row select gates 265 (e.g., 265-A, 265-B, 265-C, 265-D, 265-E, 265-F, 265-G, 265-H, 265-I, 265-J, 265-K, and 265-L), ground contact regions 267 (e.g., 267-A, 267-B, 267-C, 267-D, 267-E, 267-F, 267-I, 267-J, and 267-K), bit lines 271 (e.g., 271-1, 271-2, 271-3, 271-4), and the power rail 272. Additionally, ground shield bus lines, which may be coupled to a ground or reference voltage, are illustrated which are disposed between adjacent bit lines included in the bit lines 271 (e.g., one of the ground shield bus lines is disposed between the bit line 271-1 and the bit line 271-2 while another one of the ground shield bus lines is disposed between the bit line 271-3 and the bit line 271-4) to mitigate signal crosstalk/coupling between the bit line 271-1 and the bit line 271-2, and between the bit line 271-3 and the bit line 271-4. It is appreciated that while the bit lines 271 and the ground shield bus lines are illustrated as positioned along a common plane (i.e., the view provided by the expanded top view 251-TV-EX1), individual lines may be positioned along the same or different metal layers (e.g., as shown by the one or more metal layers 231 illustrated in FIG. 2B) and may be separated from one another by one or more intermetal dielectric layers (e.g., as shown by the one or more intermetal dielectric layers 232 illustrated in FIG. 2B). Accordingly, it is appreciated that each of the ground contact regions 267 may be coupled to an adjacent or otherwise proximate one of the ground shield bus lines.

Figure 4A:
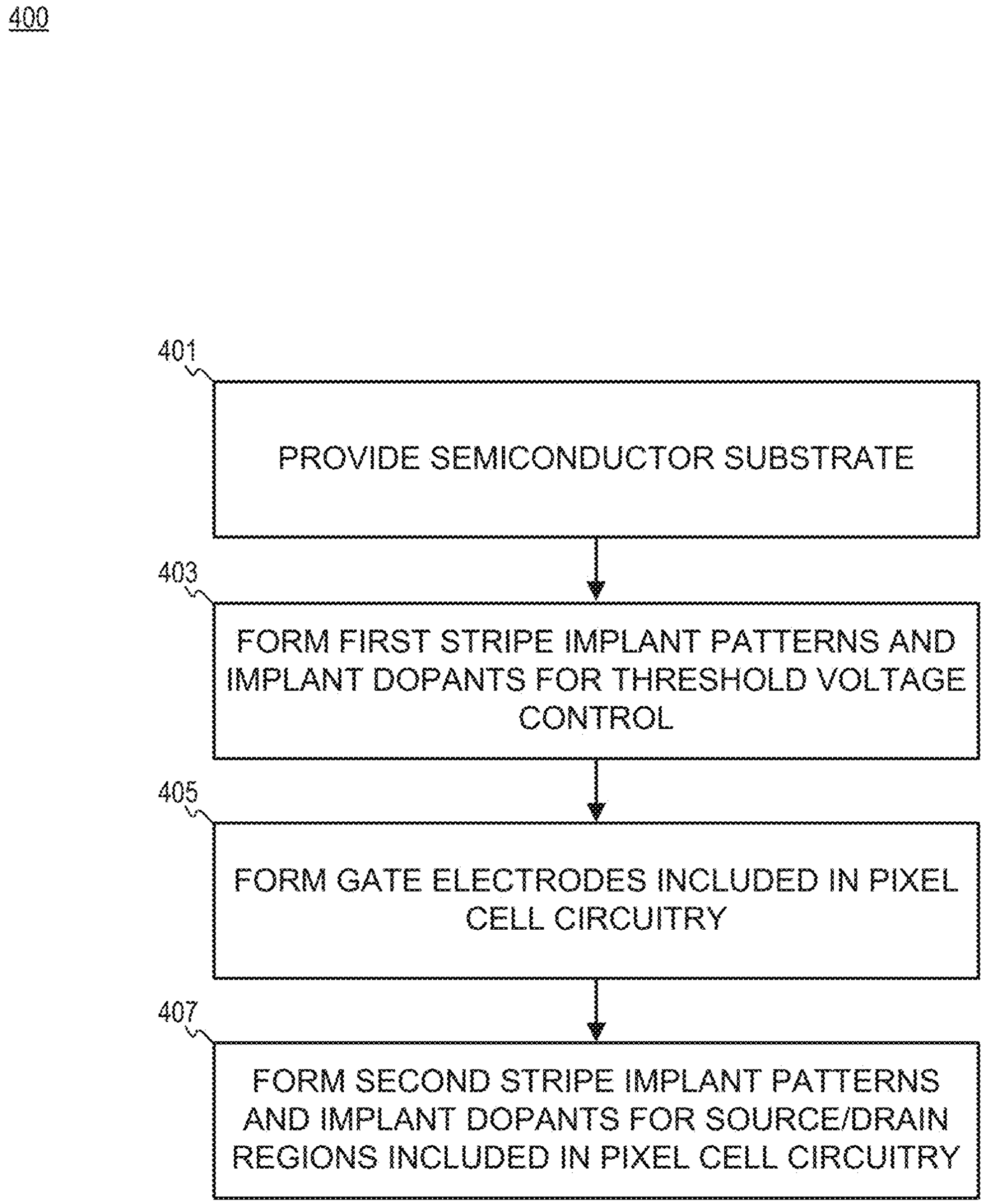
FIGS. 4A-4D illustrate an example method for forming the pixel cell circuitry included in the second semiconductor substrate of the imaging system illustrated in FIG. 2A, in accordance with embodiments of the present disclosure.

In the illustrated embodiment, the arrangement of the individual groups of components 290 may extent as needed depending on the number of pixel cells to be controlled or readout (e.g., as illustrated in FIG. 2B), which can be accomplished by mirroring an adjacent one of the individual groups of components 290. For example, the group of components 290-F mirrors the group of components 290-C, the group of components 290-E mirrors the group of components 290-A and the group of components 290-F, the group of components 290-J mirrors the group of components 290-I, 290-K, and 290-A, and so on. In other words, adjacent groups of components included in the individual groups of components 290 mirror one another, which results in two-by-two groups of elements arranged adjacent to one another (e.g., GND 267-I, 267-J, 267-E, and 267-A form a two-by-two group of ground contact regions 267 arranged adjacently, RST 261-J, RST 261-K, RST 261-A, and RST 261-B form a two-by-two group of reset gates 261 arranged adjacently, SF 263-A, SF 263-B, SF 263-C, and SF 263-D form a two-by-two group of source-follower gates 263 arranged adjacently, and RS 265-E, RS 265-A, RS 265-F, and RS 265-C form a two-by-two group of row select gates 265 arranged adjacently), which advantageously allow for easier coupling of the adjacent groups of components (if desired) and simplify fabrication (e.g., by sharing common implantation windows as illustrated in FIG. 4D).

Accordingly, certain patterns of the individual groups of components 290 can be observed. For example, the source-follower gates and row select gates of the individual groups of components 290-A, 290-B, and 290-E (e.g., SF 263-A, SF 263-B, SF 263-E, RS 265-A, RS 265-B, and RS 265-E) are arranged along a first common direction (e.g., corresponding to line X-X') while the reset gates and the ground contact regions of the individual groups of components 290-A, 290-B, and 290-E (e.g., RST 261-A, RST 261-B, RST 261-E, GND 267-A, GND 267-B, and GND 267-E) are arranged along a second common direction (e.g., corresponding to direction 288) that is separate from but parallel to the first common direction. Additionally, positionally paired source-follower gates 263 and row select gates 265 alternate along the first common direction (e.g., a paired group of SF 263-A and SF 263-B are disposed between a paired group of RS 265-A and RS 265-E and a paired group of RS 265-B and RS 265-G). Similarly, positionally paired reset gates 261 and ground contact regions 267 alternate along the second common direction (e.g., a paired group of RST 261-A and RST 261-B is disposed between a paired group of GND 267-E and GND 267-A and a paired group of GND 267-B and GND 267-G that is unillustrated but included in the individual group of components 290-G). Additionally, the source-follower gates and reset gates of the individual groups of components 290-A, 290-C, and 290-J (e.g., SF 263-A, SF 263-C, SF 263-J, RST 261-A, RST 261-C, and RST 261-J) are arranged along a third common direction (e.g., corresponding to line Y-Y') while the row select gates and the ground contact regions of the individual groups of components 290-A, 290-C, and 290-J (e.g., RS 265-A, RS 265-C, RS 263-J, GND 267-A, GND 267-C, and GND 267-J) are arranged along a fourth common direction (e.g., corresponding to direction 289) that is separate from but parallel to the third common direction. It is further appreciated that the first and second common directions are both orthogonal to the third and fourth common directions. Additionally, positionally paired source-follower gates 263 and reset gates 261 alternate along the third common direction (e.g., a paired group of SF 263-A and 263-C are disposed between paired groups of reset gates such as a paired group of RST 261-A and RST 261-J and a paired group of RS 261-C and an unillustrated reset gate disposed adjacent to RST 261-C). Similarly, positionally paired row select gates 265 and ground contact regions 267 alternate along the fourth common direction (e.g., a paired group of RS 265-A and 265-C are disposed between paired groups of ground contact regions such as a paired group of GND 267-A and GND 267-J and a paired group of GND 267-C and an unillustrated ground contact region disposed adjacent to GND 267-C).

FIG. 2J illustrates an expanded top view 251-TV-EX2 of the second semiconductor substrate 251 included in the example imaging system 200 of FIG. 2A in an embodiment where ground contact regions 267 are shared, in accordance with embodiments of the present disclosure. More specifically, the expanded top view 251-TV-EX2 is an alternative embodiment to the expanded top view 251-TV-EX1 in FIG. 2J and includes many like-labeled elements. One difference is that adjacent ones of the ground contact regions 267 have been consolidated to be shared by adjacent ones (e.g., two-by-two groups) of the individual groups of components 290. For example, individual groups of components 290-I, 290-J, 290-E, and 290-A share ground contact region 267-1 (e.g., which corresponds to GND 267-I, 267-J, 267-E, and 267-A illustrated in FIG. 2I extending from one another to form the shared ground contact region). Similarly, individual groups of components 290-K, 290-L, 290-B, and 290-G share ground contact region 267-2 while GND 267-3 is shared by at least individual groups of components 290-F and 290-C and GND 267-3 is shared by at least individual groups of components 290-D and 290-H. It is appreciated that consolidating or sharing ground contact regions may further improve space efficiency/utilization of the second semiconductor substrate 251.

FIG. 2K is a schematic diagram 299 of a pixel cell (e.g., the first pixel cell 205-1 illustrated in FIG. 2C) and pixel cell circuitry (e.g., one of the groups of individual components 290) included in the example imaging system 200 of FIG. 2A, in accordance with embodiments of the present disclosure. In particular, the schematic diagram 299 is one possible representation of the pixel cell illustrated in FIGS. 2C-2D (e.g., the first pixel cell 205-1). The schematic diagram 299 illustrates elements included in or on the first semiconductor substrate 201. Elements PD1, PD2, PD3, and PD4 correspond to respective photodiodes included in the plurality of photodiodes 204 illustrated in FIG. 2B (e.g., the first photodiode 204-1, the second photodiode 204-2, and so on) are respectively associated with the plurality of pixels 210 included in the pixel cell 205-1 illustrated in FIG. 2C (e.g., PD1 corresponds to the first photodiode 204-1 associated with the first pixel 210-1, PD2 corresponds to the second photodiode 204-2 associated with the second pixel 210-2, and so on). Elements TX1, TX2, TX3, and TX4 correspond to respective transfer gates included in the plurality of transfer gates 220 illustrated in FIG. 2C (e.g., the first transfer gate 220-1, the second transfer gate 220-2, and so on) are respectively associated with the plurality of pixels 210 of the first pixel cell 205-1 illustrated in FIG. 2C (e.g., TX1 corresponds to the first transfer gate 220-1 associated with the first pixel 210-1, TX2 corresponds to the second transfer gate 220-2 associated with the second pixel 210-2, and so on). Elements FD1, FD2, FD3, and FD4 correspond to respective floating diffusion regions included in the plurality of floating diffusion regions 221 illustrated in FIG. 2C (e.g., the first floating diffusion region 221-1, the second floating diffusion region 221-2, and so on) that are respectively associated with the plurality of pixels 210 included in the first pixel cell 205-1 illustrated in FIG. 2C (e.g., FD1 corresponds to the first floating diffusion region 221-1 associated with the first pixel 210-1, FD2 corresponds to the second floating diffusion region 221-2 associated with the second pixel 210-2, and so on). Additionally, each of the unlabeled grounds coupled to the plurality of floating diffusion regions (i.e., FD1, FD2, FD3, and FD4) correspond to the plurality of ground contact regions 223 illustrated in FIG. 2C.

In the embodiment illustrated by FIG. 2K, the first semiconductor substrate 201 is coupled to the second semiconductor substrate 251 (e.g., as shown in FIG. 2A). The second semiconductor substrate 251 includes pixel cell circuitry associated with the plurality of pixel cells of the first semiconductor substrate 201. In the illustrated embodiment, the pixel cell circuitry includes a reset transistor RST, including a reset gate (e.g., one of the reset gates 261 illustrated in FIG. 2E), a source-follower transistor SF, including a source-follower gate (e.g., one of the source-follower gates 263 illustrated in FIG. 2E), and a row select transistor RS, including a row select gate (e.g. one of the row select gates 265 illustrated in FIG. 2E), which may correspond to one of the groups of components 290 illustrated in FIG. 2E-2H. As illustrated by the schematic 299, each of the plurality of floating diffusion regions for the pixel cell (i.e., FD1, FD2, FD3, and FD4) are coupled together and subsequently coupled to components (e.g., one of the source-follower gates 263 and one of reset gates 261 illustrated in FIG. 2E) the second semiconductor substrate 251 via a pixel-level hybrid bond (PLHB). In some embodiments, the PLHB is achieved, at least in part, by forming a corresponding floating diffusion region within the second semiconductor substrate 251 that can be coupled to the reset transistor and source-follower transistor of the second semiconductor substrate 251. Thus, in the illustrated embodiment, the pixel cell circuitry of the second semiconductor substrate 251 is coupled to the plurality of pixel cells of the first semiconductor substrate 201 on a per-pixel cell basis.

It is appreciated that during operation, image charge photogenerated in response to incident light by the plurality of photodiodes (i.e., PD1, PD2, PD3, and PD4) can be selectively transferred to their respective floating diffusion regions (i.e., FD1, FD2, FD3, FD4) in response to a signal applied to plurality of transfer gates (i.e., TX1, TX2, TX3, and TX4), which may subsequently turn on the source-follower transistor SF supplied by AVDD of the second semiconductor substrate 251 and enable readout to the bit line via the row select transistor RS. It is appreciated the floating diffusion regions (i.e., FD1, FD2, FD3, FD4) and the plurality of photodiodes (i.e., PD1, PD2, PD3, and PD4) can be reset to a pre-determined potential (e.g., RSVDD) via the reset transistor RST. It is appreciated that while the schematic 299 is similar to the 4-T pixel driver circuit, other configurations may also be used (e.g., 3-T, 5-T, or other pixel driver configurations), in accordance with embodiments of the disclosure. It is further appreciated that plurality of transfer gates can be used to selectively electrically couple the photodiodes included in pixels of a given pixel cell to the source-follower gate associated with the source-follower transistor SF included in one of the individual groups of components.

Figure 3:
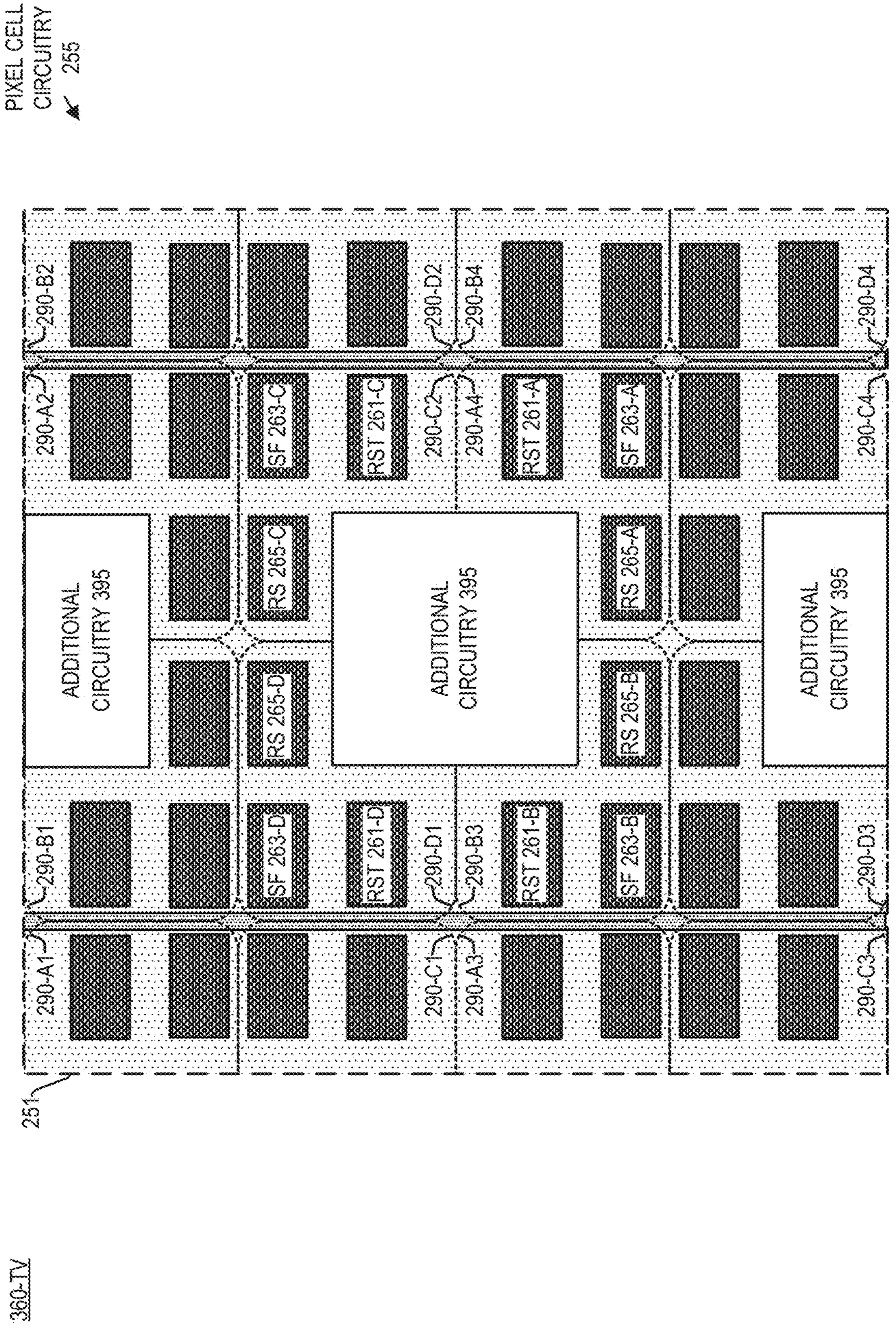
FIG. 3 illustrates an expanded top view of a second semiconductor substrate included in the example imaging system of FIG. 2A showing additional circuitry disposed in or on the second semiconductor substrate, in accordance with embodiments of the present disclosure.

FIG. 3 illustrates an expanded top view 360-TV of the second semiconductor substrate 251 included in the example imaging system 200 of FIG. 2A showing additional circuitry 395 disposed in or on the second semiconductor substrate 251, in accordance with embodiments of the present disclosure. To avoid obscuring certain aspects of the disclosure the ground contact regions 267 illustrated in FIG. 2E have been omitted from view. Referring back to FIG. 3C the pixel cell circuitry 255 includes the individual groups of components 290, which have been annotated differently for clarity. Specifically, there are multiple instances of the first group of components 290-A (e.g., 290-A1, 290-A2, 290-A3, and 249-A4), the second group of components 290-B (e.g., 290-B1, 290-B2, 290-B3, and 249-B4), the third group of components 290-C (e.g., 290-C1, 290-C2, 290-C3, and 290-C4), and the fourth group of components 290-D (e.g., 290-D1, 290-D2, 290-D3, and 290-D4), which each have a configuration of their liked named element illustrated in FIGS. 2E-2H. The multiple instances are arranged in rows and columns in or on respective portions of the second semiconductor substrate 251 to form a pixel circuitry array. As illustrated, the multiple instances are arranged such that an adjacent set of four of the individual groups of components (e.g., one of the first group of components 290-A, one of the second group of components 290-B, one of the third group of components 290-C, and one of the fourth group of components 290-D) span two adjacent rows included in the rows and two adjacent columns included in the columns. Each of the reset gate 261, the source-follower gate 263, and the row select gate 265 of the adjacent set collectively surround additional circuitry 395 associated with the image sensor. For example, SF 263-D, RS 265-D, and RST 261-D of the group of components 290-D1, RS 265-C, SF 263-C, and RST 261-C of the group of components 290-C2, RST 261-B, SF 263-B, and RS 265-B of the group of components 290-B3, and RST 261-A, SF 263-A, and RS 265-A of the group of components 290-A4 collectively and laterally surround a substrate region for the additional circuitry 395. It is appreciated that the area available on the second semiconductor substrate 251 based on the configuration of the individual groups of components 290 allows for a first lateral area of the additional circuitry (or the underlying portion of the second semiconductor substrate 251) to be greater than a second lateral area of any one of the reset gates 261, the source-follower gates 263, or the row select gates 265 included in each of the individual groups of components 290. It is appreciated that the additional circuitry 395 may include at least one of additional transistors, switchable conversation gain circuitry (e.g., a capacitor coupled to a transistor to form or otherwise included in a switchable conversation transistor or dual floating transistors for a LOFIC circuit, an array of capacitors such as an array of LOFIC capacitors, or an array of metal-oxide semiconductor capacitors for each one of the pixel cells for enhancing dynamic range), a storage node (e.g., for a global shutter), other components for the imaging system, or combinations thereof.

FIGS. 4A-4D illustrate an example method 400 for forming the pixel cell circuitry 255 included in the second semiconductor substrate 251 of the imaging system 200 illustrated in FIG. 2A, in accordance with embodiments of the present disclosure. It is appreciated that the pixel cell circuitry resultant from the method 400 is one possible process for fabricating the second semiconductor substrate 251 of the imaging system 200 illustrated in FIGS. 2A-2K. It is appreciated that while the process steps of the method 400 illustrated in FIGS. 4A-4D are provided in a specific order, in other embodiments a different order of steps 401, 403, 405, and 407 may be utilized. Additionally, process steps may be added to, or removed from, the method 400 in accordance with the embodiments of the present disclosure. The process steps illustrated in FIGS. 4A-4D may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

Block 401 shows providing a semiconductor substrate (e.g., the second semiconductor substrate 251 illustrated in FIG. 2A), including a first side and a second side, the first side opposite the second side. The semiconductor substrate may include shallow trench isolation structures (e.g., shallow trench isolation structures 273 illustrated in FIGS. 2F-2H) and wells (e.g., well 257 illustrated in FIGS. 2F-2H), which may define regions of the semiconductor substrate where individual groups of components (e.g., the individual groups of components 290 illustrated in FIGS. 2E-2K) are to be formed or otherwise located. Shallow trench isolation structures (e.g., shallow trench isolation structures 273 illustrated in FIGS. 2F-2H) may be formed by patterning and etching (e.g., dry and/or wet etching) trenches on the semiconductor substrate and filling the trenches with one or more isolation materials (e.g., a dielectric material such as silicon dioxide) for isolating components within a particular group of components and/or isolating groups of components from one another. In some embodiments, the shallow trench isolation structures may be formed in a grid of trenches etched into the semiconductor substrate.

Block 403 illustrates forming first stripe implant patterns and implanting dopants for threshold voltage control (e.g., of reset, row select, and/or source-follower transistors as illustrated in FIGS. 2E-2H) as well as heavily doped regions associated with ground contact regions (as illustrated in FIG. 2H). In some embodiments, patterned photoresist with first stripe implant patterns mask may be aligned with one or more shallow trench isolation structures formed in the semiconductor substrate. FIG. 4B provides examples of first stripe implant patterns of patterned photoresist positioned on the second semiconductor substrate 251. Specifically, for each type of transistor receiving threshold voltage adjustment, there may be at least a two step process of forming patterned photoresist with openings followed by ion implantation through the openings into corresponding channel regions. For example, a first photoresist layer with openings 481 may form one of the first stripe implant patterns for the threshold voltage adjustment of the reset transistors of adjacently disposed groups of components to be included in the pixel cell circuitry. Referring to the layout illustrated in FIG. 2E, the opening 481 illustrated in FIG. 4B may cover an active region of the reset transistor of the first group of components 290-A (e.g., a channel region underneath reset gate 261-A) and an active region of the reset transistor of second group of components 290-B (e.g., a channel region underneath reset gate 261-B). In the same or another embodiment, a second photoresist layer with openings 483 may form one of the first stripe implant patterns with an implantation window area size complying with processing design rules for the threshold voltage adjustment of the source-follower transistors adjacently disposed groups of components to be included in the pixel cell circuitry. Referring to the layout illustrated in FIG. 2E, the opening 483 illustrated in FIG. 4B may cover an active region of source-follower transistor of first group of components 290-A (e.g., a channel region underneath source-follower gate 263-A) and an active region of source-follower transistor of second group of components 290-B (e.g., a channel region underneath source-follower gate 263-B). Additionally, in one embodiment, third photoresist layer with openings 485 may form one of the first stripe implant patterns for the threshold voltage adjustment of the row select transistors of adjacent disposed groups of components to be included in the pixel cell circuitry. Referring to the layout illustrated in FIG. 2E, the opening 485 of FIG. 4B may cover an active region of row select transistor of first group of components 290-A (e.g., a channel region underneath row select gate 265-A) and an active region of row select transistor of an adjacent group of components (e.g., disposed on the left of the first group of components 290-A such as a channel region underneath row select gate 265-E illustrated in FIG. 2I). In another embodiment and referring back to FIG. 4B, a fourth photoresist layer with openings 489 may form one of the first stripe implant patterns for forming the heavily doped region to be coupled to or otherwise form ground contact regions included in the pixel cell circuitry. It is further appreciated that the first stripe patterns of the patterned photoresist layer mitigate the issue of corner rounding within the patterned photoresist layer due to the corners 484 of the patterned photoresist layer being positioned over regions away from active regions of transistors (e.g., the channel region formed by the transistors under respective gate electrode). Specifically, threshold voltage adjustment may be achieved by lightly doping the channel of the transistor, which is unaffected by the corner rounding at the edges of the openings 481, 483, and 485. By having the corners 484 of the openings 481, 483, and 485 away from the regions of the second semiconductor substrate 251 that are intended to form the channel of the reset, source-follower, and row select transistors while at that same time sharing implantation processing windows for similar transistor elements (e.g., like named) that are disposed adjacent to one another (e.g., for adjacent groups of the individual groups of components), performance variance due to the corner rounding and/or processing variance can be mitigated and meeting design rule requirements for a given semiconductor processing node even with decreasing pixel size and/or pixel pitch in sub-micron range.

Figure 4B:
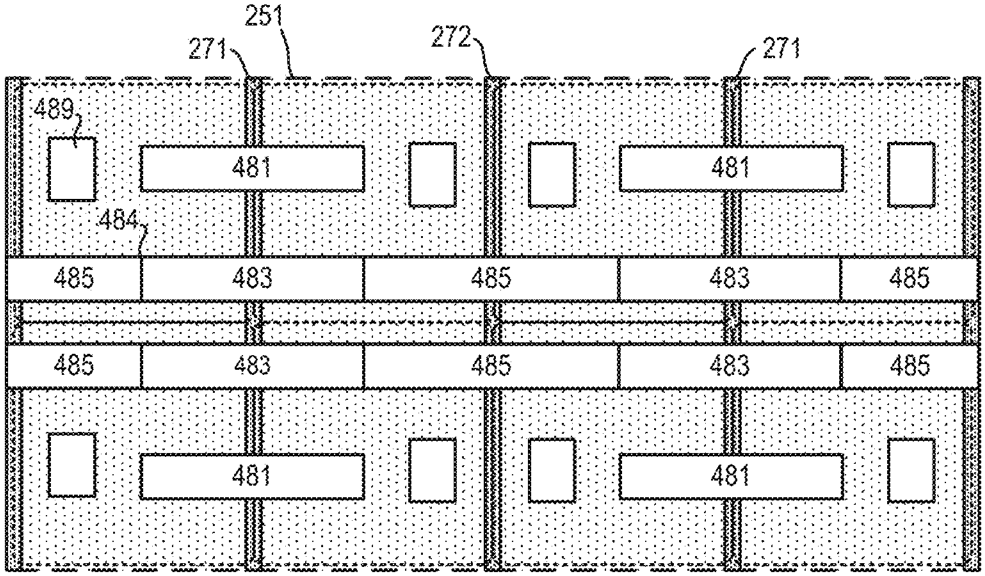
Figure 4C:
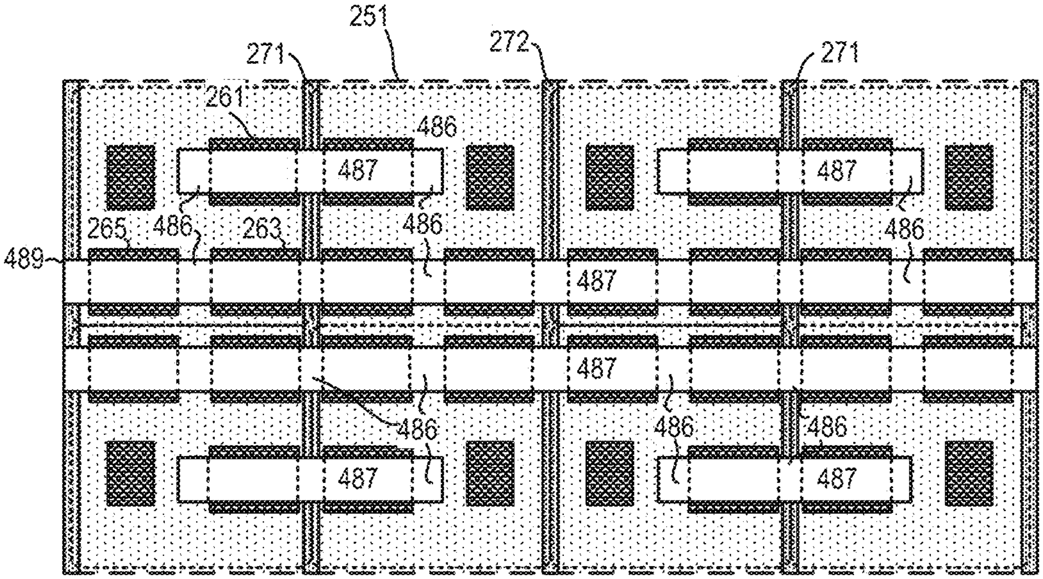
Figure 4D:
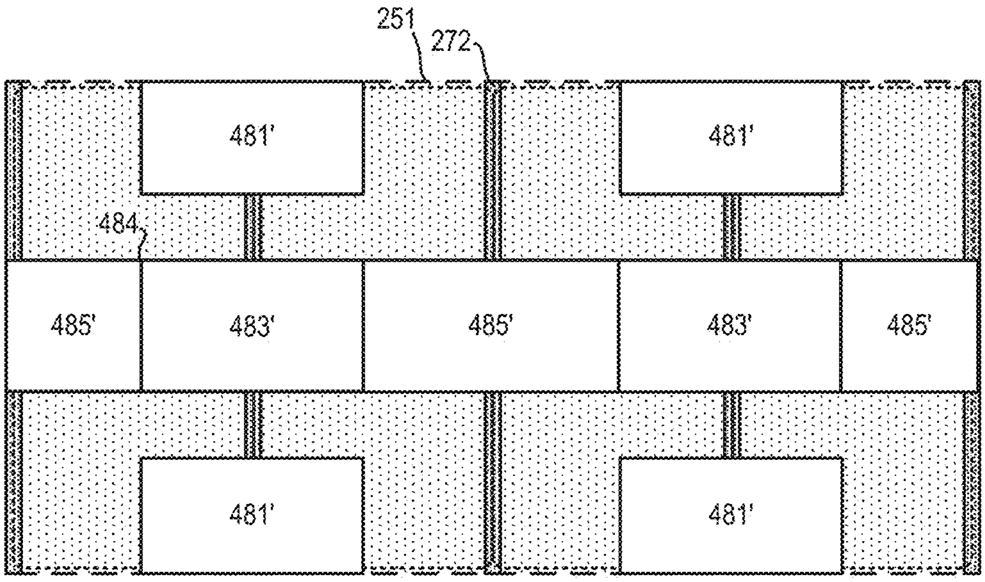

It is appreciated that, although bit lines 271 and power rails 272 are illustrated in at least FIG. 4B and FIG. 4C, it is worth nothing that the bit lines 271 and the power rails 272 may be formed after the formation of the reset, row select, and/or source-follower transistors and/or at different layers (e.g., included in the metallization layer 230 illustrated in FIG. 2B). For example, bit lines 271 and power rails 272 may be formed in one or more metal layers (e.g., one or more metal layers 231 disposed between one or more intermetal dielectric layers 232 illustrated in FIG. 2B) on the second semiconductor substrate 251 above the gate electrodes for the reset, row select, and/or source-follower transistors. It is further appreciated that depending on wiring needs, bit lines 271 and power rails 272 may be on the same or different metal layers.

Referring back to FIG. 4A, block 405 shows forming gate electrodes included in the pixel cell circuitry (e.g., gates for the reset, row select, and/or source-follower transistors as illustrated in FIGS. 2E-2H such as reset gates 261, source-follower gates 263, and row select gates 265) as well ground contact regions (e.g., ground contact regions 267 illustrated in FIGS. 2E-2H). The gate electrodes and/or ground contact regions included in the pixel circuitry may be formed by depositing polycrystalline silicon, a metal such as gold, aluminum, silver, copper, or other conductive material. It is appreciated that the gate electrodes act as a buffer or barrier in subsequent steps (e.g., to form the source/drain regions and/or lightly doped drain regions of the transistors included in the pixel cell circuitry).

Block 407 illustrates forming second stripe implant patterns and implanting dopants for source/drain regions and optionally the lightly doped drain regions included in the pixel cell circuitry (e.g., source/drain regions 269 illustrated in FIGS. 2E-2H and optionally lightly doped drain regions on top of the source/drain regions 269). FIG. 4C provides examples of second stripe implant patterns of patterned photoresist positioned on the second semiconductor substrate 251. Specifically, a photoresist layer with openings 487 may form the second stripe implant pattern for forming both the source/drain regions during a source/drain region ion implantation step and optionally the lightly doped drain regions during a subsequent ion implantation step. During the ion implantation step, ions are implanted into the second semiconductor substrate 251 through the openings 487. However, the gate electrodes (e.g., the reset gates 261, the source-follower gates 263, and the row select gates 265) may prevent the dopants from reaching the underlying second semiconductor substrate 251 since the openings 487 overlap with the gate electrodes. Accordingly, the dopants only implanted into the intended regions 486 and in the second semiconductor substrate 251 where the gate electrodes do not overlap with the openings 487 to form source/drain regions and/or lightly doped drains having self-alignment to edges of a respective gate electrodes. It is further appreciated that the second stripe patterns of the patterned photoresist layer mitigate the issue of corner rounding within the patterned photoresist layer due to the corners 489 of the patterned photoresist layer being positioned over regions sufficiently away from the interface where the source/drain regions and/or lightly doped drain region meet the channel region formed by the transistors, which mitigates performance variance due to the corner rounding and/or processing variance, improves the pixel cell circuitry formation process while at same time providing a sufficient implantation window for pixel transistors complying with processing design rules even for pixel pitches reduced to a sub-micron range (e.g., less than 0.6 μm).

It is appreciated that FIG. 4D provides an alternative extension to the openings illustrated in FIG. 4B for the process block 403 illustrated in FIG. 4A. Specifically, the openings 481', 483', and 485' can be extended to form first stripe patterns that cover multiple regions intended to be doped for threshold voltage adjustment. In other words, larger openings can be utilized such that each opening is associated with threshold voltage control for multiple rows and columns of transistors, which may further mitigate processing variance. For example, the threshold voltage adjustment regions 275 shown in FIG. 2F for the source-follower transistors of the first group of components 290-A and the second group of components 290-B can be formed and implanted simultaneously with an appropriately located one of the openings 483', while the source-follower transistors of the third group of components 290-C and the fourth group of components 290-D can be formed and implanted simultaneously with another appropriately located one of the openings 483'. In another example, the source-follower transistors of the first group of components 290-A, the second group of components 290-B, the third group of components 290-C, and the fourth group of components 290-D illustrated in FIG. 2E can be formed and implanted simultaneously with an appropriately located one of the openings 483' illustrated in FIG. 4D. The threshold voltage adjustment region 277 illustrated in FIG. 2F of the row select transistors of the first group of components 290-A and the third group of components 290-C illustrated in FIG. 2E can be formed simultaneously with an appropriately located one of the openings 485' illustrated in FIG. 4D. Similarly, the threshold voltage adjustment region 277 of the row select transistors of the second group of components 290-B and the group of components adjacent thereto (e.g., row select transistors from the group of component 290-G disposed on right side adjacent the second group of components 290-B) may be formed simultaneously with another appropriately sized and located one of the openings 485' illustrated in FIG. 4D, and the threshold voltage adjustment region 277 of the row select transistors of the fourth group of components 290-D and the group of components adjacent thereto (e.g., row select transistors from the group of component 290-H disposed on the right adjacent to the se send-fourth group of components 290-D) may be formed simultaneously with an appropriately sized and located one of the openings 485' illustrated in FIG. 4D. In some embodiments, the threshold voltage adjustment region 277 of the row select transistors of the second group of components 290-B and the fourth group of components 290-D as well as the groups of components adjacent thereto (e.g., row select transistors from the group of component 290-G and 290-H disposed on the right adjacent to the second group of components 290-B and the fourth group of components 290-D, respectively, as illustrated in FIG. 2I and FIG. 2J) can be formed simultaneously with another appropriately located one of the openings 485' illustrated in FIG. 4D. The threshold voltage adjustment region 279 of the reset transistors of the first group of components 290-A and the second group of components 290-B as well as group of components adjacent thereto (e.g., resets transistors from group of components disposed on upper side adjacent the first group of components 290-A and the second group of components 290-B, respectively, as illustrated in FIG. 2I and FIG. 2J) can be formed simultaneously with another appropriately located one of the openings 481' illustrated in FIG. 4D. Similarly, the source/drain regions for multiple rows can be formed simultaneously by expanding the openings 487 illustrated in FIG. 4C (e.g., the openings may be expanded such that the two illustrated openings 487 form an individual stripe). Advantageously, the layout of the groups of components (e.g., as illustrated in FIG. 2E) enables wider implantation process window for simultaneous formation of the threshold voltage adjustment regions and/or source/drain regions of multiple transistors to be formed (e.g., the source-follower transistors of adjacent pixels or pixel cells can be formed at the same time as a benefit of the illustrated layout).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:

a semiconductor substrate including a first side and a second side opposite of the first side;

pixel cell circuitry disposed proximate to the first side of the semiconductor substrate, wherein the pixel cell circuitry includes an arrangement of individual groups of components, each including a reset gate, a source-follower gate, and a row select gate, wherein the individual groups of components includes a first group and a second group adjacent to the first group, and wherein the source-follower gate of the first group is disposed adjacent to the source-follower gate of the second group.

2. The image sensor of claim 1, wherein the arrangement of the individual groups of components included in the pixel cell circuitry is mirror symmetric about a first axis.

3. The image sensor of claim 2, wherein the arrangement of the individual groups of components included in the pixel cell circuitry is mirror symmetric about a second axis, and wherein the second axis is orthogonal to the first axis.

4. The image sensor of claim 3, wherein the arrangement of the individual groups of components included in the pixel cell circuitry is further mirror symmetric about a diagonal axis extending between the first axis and the second axis.

5. The image sensor of claim 2, wherein the first axis is parallel with at least one of a power rail or a bit line disposed proximate to the semiconductor substrate of the image sensor.

6. The image sensor of claim 1, wherein the individual groups of components of the pixel cell circuitry are arranged in or on respective portions of the semiconductor substrate to form a pixel circuitry array, the respective portions of the semiconductor substrate arranged in rows and columns such that an adjacent set of four of the individual groups of components span two adjacent rows included in the rows and two adjacent columns included in the columns and wherein the adjacent set collectively form pixel transistors for a full-color image pixel of the image sensor.

7. The image sensor of claim 1, wherein the individual groups of components of the pixel cell circuitry are arranged in or on respective portions of the semiconductor substrate to form a pixel circuitry array, the respective portions of the semiconductor substrate arranged in rows and columns such that an adjacent set of four of the individual groups of components span two adjacent rows included in the rows and two adjacent columns included in the columns, and wherein each of the reset gate, the source-follower gate, and the row select gate of the adjacent set collectively surround a region of the semiconductor substrate having a first lateral area.

8. The image sensor of claim 7, wherein the first lateral area is greater than a second lateral area of any one of the reset gate, the source-follower gate, or the row select gate included in each of the individual groups of components.

9. The image sensor of claim 7, further comprising additional circuitry associated with the image sensor formed in or on the region of the semiconductor substrate having the first lateral area, and wherein the additional circuitry includes at least one of a switchable conversion gain circuit or a storage node of the image sensor.

10. The image sensor of claim 1, wherein the individual groups of components further includes a third group and a fourth group respectively arranged adjacent to the first group and the second group to form a two-by-two array included in the individual groups of components, wherein the third group is adjacent to the fourth group wherein the source-follower gate and the row select gate of both the first group and the second group are arranged along a first direction, wherein the source-follower gate and the row select gate of the third group and the fourth group are aligned along a second direction separated from, but parallel to, the first direction.

11. The image sensor of claim 10, wherein the first direction and the second direction are orthogonal to the first axis.

12. The image sensor of claim 1, wherein the source-follower gate of the first group and the source-follower gate of the second group are coupled to a common junction region formed in the semiconductor substrate.

13. The image sensor of claim 1, wherein the reset gate of the first group is disposed adjacent to the reset gate of the second group.

14. The image sensor of claim 13, wherein the source-follower gate of the first group and the source-follower gate of the second group are arranged along a first direction, wherein the reset gate of the first group and the source-follower gate of the first group are arranged along a second direction orthogonal to the first direction.

15. The image sensor of claim 1, wherein the individual groups of components further includes a third group and a fourth group respectively arranged adjacent to the first group and the second group, wherein the source-follower gate of the first group and the second group are arranged along a first direction, wherein the source-follower gate of the third group and the source-follower gate of the fourth group are arranged along a second direction separated from but parallel to the first direction, wherein the source-follower gate of the first group and the source-follower gate of the third group are arranged along a third direction orthogonal to the first direction, and wherein the source-follower gate of the second group and the source-follower gate of the fourth group are arranged along a fourth direction separated from but parallel to the third direction.

16. The image sensor of claim 1, further comprising threshold voltage adjustment regions disposed within the semiconductor substrate including:

a first threshold voltage adjustment region disposed between the source-follower gate of the first group and the second side of the semiconductor substrate; and a second threshold voltage adjustment region disposed between the source-follower gate of the second group and the second side of the semiconductor substrate, wherein the source-follower gate of the first group and the source-follower gate of the second group are arranged along a first direction, and wherein formation of the first threshold voltage adjustment region and the second threshold voltage adjustment region is achieved using a common implantation window such that doping concentrations of the first threshold voltage adjustment region and the second threshold voltage adjustment region are equivalent.

17. The image sensor of claim 1, wherein the individual groups of components further includes a third group arranged adjacent to first group such that the first group is disposed between the second group and the third group, wherein the individual groups of components each further comprises a ground contact region, and wherein the ground contact region of the first group is disposed adjacent to the ground contact region of the third group.

18. The image sensor of claim 17, wherein the source-follower gate of the first group, the source-follower gate of the second group, the source-follower gate of the third group, the row select gate of the first group, the row select gate of the second group, and the row select gate of the third group are disposed along a first common direction, wherein the reset gate of the first group, the reset gate of the second group, the reset gate of the third group, the ground contact region of the first group, the ground contact region of the second group, and the ground contact region of the third group are disposed along a second common direction separated from but parallel to the first common direction.

19. The image sensor of claim 17, further comprising a ground shield bus line disposed between a first bit line and a second bit line, wherein the ground contact region of the first group and the ground contact region of the third group are both coupled to the ground shield bus line.

20. The image sensor of claim 17, wherein the ground contact region of the first group extends from the ground contact region of the third group to form a shared ground contact region.

21. The image sensor of claim 1, wherein the individual groups of components further includes a third group and a fourth group respectively arranged adjacent to the first group and the second group to form a two-by-two array included in the individual groups of components, wherein the source-follower gate of the first group is positioned adjacent to both the source-follower gate of the second group and the source-follower gate of the third group, and wherein the source-follower gate of the fourth group is positioned adjacent to both the source-follower gate of the second group and the source-follower gate of the third group.

* * * * *